US012750729B2

(12) United States Patent
Yang et al.

(10) Patent No.: US 12,750,729 B2
(45) Date of Patent: Sep. 29, 2026

(54) DATA COMPRESSION AND CHANNEL CODING TECHNIQUES FOR VARIABLE LENGTH PAYLOADS

(71) Applicant: QUALCOMM Incorporated, San Diego, CA (US)

(72) Inventors: Wei Yang, San Diego, CA (US); Jing Jiang, San Diego, CA (US); Pinar Sen, San Diego, CA (US); Kirill Ivanov, La Jolla, CA (US); Mostafa Khoshnevisan, San Diego, CA (US); Jing Sun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 246 days.

(21) Appl. No.: 18/640,762

(22) Filed: Apr. 19, 2024

(65) Prior Publication Data

US 2025/0330872 A1 Oct. 23, 2025

(51) Int. Cl.
*H04W 28/06* (2009.01)
*H03M 13/00* (2006.01)
(Continued)

(52) U.S. Cl.
CPC ........... *H04W 28/06* (2013.01); *H03M 13/13* (2013.01); *H03M 13/3927* (2013.01); *H03M 13/6312* (2013.01); *H04L 1/0008* (2013.01)

(58) Field of Classification Search
CPC . H04W 28/06; H03M 13/13; H03M 13/3927; H03M 13/6312; H03M 7/40; H03M 7/3059; H04L 1/0008; H04L 1/0023; H04L 1/0009; H04L 1/0033; H04L 1/0073; H04L 1/0075
See application file for complete search history.

(56) References Cited

U.S. PATENT DOCUMENTS 6,668,015 B1 * 12/2003 Kranawetter ........ H04N 19/895 375/240.23
2010/0329308 A1 * 12/2010 Kim ....................... H03M 13/11 714/752
(Continued)

FOREIGN PATENT DOCUMENTS

WO 2023236128 A1 12/2023

OTHER PUBLICATIONS

WO_2023236128_A1 (Year: 2023).*
(Continued)

*Primary Examiner* — Rushil P. Sampat
(74) *Attorney, Agent, or Firm* — Patterson + Sheridan, L.L.P.

(57) ABSTRACT

Certain aspects of the present disclosure provide data compression and channel coding techniques for variable length payloads. A method performed at a wireless node may include obtaining a payload for transmission, compressing the payload using a variable length compression technique to obtain a compressed payload having compressed payload bits of a first length, adding padding bits to the compressed payload to obtain a padded compressed payload. The padded compressed payload comprises information bits including the compressed payload bits and the padding bits. The method further includes encoding the padded compressed payload and outputting the encoded padded compressed payload.

20 Claims, 12 Drawing Sheets

(51) Int. Cl.

| | |
|---|---|
| ***H03M 13/13*** | (2006.01) |
| ***H03M 13/39*** | (2006.01) |
| ***H04L 1/00*** | (2006.01) |

(56) References Cited

U.S. PATENT DOCUMENTS

| | | | | |
|---|---|---|---|---|
| 2017/0019210 | A1* | 1/2017 | Yu | H04L 1/007 |
| 2017/0324605 | A1* | 11/2017 | Hong | H04L 27/3494 |
| 2019/0081730 | A1* | 3/2019 | Oveis Gharan | H03M 13/6312 |
| 2019/0306834 | A1* | 10/2019 | Hwang | H04L 69/04 |
| 2020/0295870 | A1* | 9/2020 | Jing | H04Q 11/0067 |
| 2020/0313695 | A1* | 10/2020 | Namboodiri | H03M 13/611 |
| 2022/0085914 | A1* | 3/2022 | Yu | H03M 13/251 |
| 2025/0125904 | A1* | 4/2025 | Baligh | H04L 1/0073 |
| 2025/0323987 | A1* | 10/2025 | Xue | H04L 69/18 |

OTHER PUBLICATIONS

Dong Y., et al., "Joint Successive Cancellation List Decoding for the Double Polar Codes", arXiv:2201.02924v1 [cs.IT], Cornell University Library, 201 Olin Library Cornell University Ithaca, NY 14853, Jan. 9, 2022, pp. 1-6, XP091133110.

EN 300 421: "Digital Video Broadcasting (DVB); Framing Structure, Channel Coding and Modulation for 11/12 GHZ Satellite Services", ETSI, Sophia Antipolis Valbonne—France, V1.1.2, Aug. 31, 1997, pp. 1-24, XP093279614, Sections 4.4, 4.5.

International Search Report and Written Opinion—PCT/US2025/020230—ISA/EPO—Jun. 11, 2025.

Wu B., et al., "Joint Source-Channel Polar-Coded Modulation", 2022 IEEE International Symposium on Information Theory (ISIT), IEEE, Jun. 26, 2022, pp. 2356-2361, XP034160316, abstract, Section III, Figure 1.

* cited by examiner

DATA COMPRESSION AND CHANNEL CODING TECHNIQUES FOR VARIABLE LENGTH PAYLOADS

BACKGROUND

Field of the Disclosure

Aspects of the present disclosure relate to wireless communications, and more particularly, to data compression and channel coding techniques for variable length payloads.

Description of Related Art

Wireless communications systems are widely deployed to provide various telecommunication services such as telephony, video, data, messaging, broadcasts, or other similar types of services. These wireless communications systems may employ multiple-access technologies capable of supporting communications with multiple users by sharing available wireless communications system resources with those users.

Although wireless communications systems have made great technological advancements over many years, challenges still exist. For example, complex and dynamic environments can still attenuate or block signals between wireless transmitters and wireless receivers. Accordingly, there is a continuous desire to improve the technical performance of wireless communications systems, including, for example: improving speed and data carrying capacity of communications, improving efficiency of the use of shared communications mediums, reducing power used by transmitters and receivers while performing communications, improving reliability of wireless communications, avoiding redundant transmissions and/or receptions and related processing, improving the coverage area of wireless communications, increasing the number and types of devices that can access wireless communications systems, increasing the ability for different types of devices to intercommunicate, increasing the number and type of wireless communications mediums available for use, and the like. Consequently, there exists a need for further improvements in wireless communications systems to overcome the aforementioned technical challenges and others.

SUMMARY

One aspect provides a method for wireless communication at a wireless node. The method includes obtaining a payload; compressing the payload using a variable length technique to obtain a compressed payload having compressed payload bits of a first length; adding padding bits to the compressed payload to obtain a padded compressed payload, wherein the padded compressed payload comprises information bits that include the compressed payload bits and the padding bits; encoding the padded compressed payload; and outputting the encoded padded compressed payload.

Another aspect provides a method for wireless communication at a wireless node. The method includes obtaining an encoded padded compressed payload, wherein: the encoded padded compressed payload includes a padded compressed payload, and the padded compressed payload comprises information bits including compressed payload bits and padding bits; demodulating the encoded padded compressed payload to obtain a first set of channel log likelihood ratios (LLRs) corresponding to bits in the set of information bits of the padded compressed payload; decoding the encoded padded compressed payload using the set of channel LLRs and a set of prior LLRs to obtain the information bits of the padded compressed payload; removing the padding bits from the padded compressed payload to obtain the compressed payload including the compressed payload bits; and decompressing the compressed payload, including the compressed payload bits, to obtain payload bits.

Other aspects provide: an apparatus operable, configured, or otherwise adapted to perform any one or more of the aforementioned methods and/or those described elsewhere herein; a non-transitory, computer-readable media comprising instructions that, when executed by one or more processors of an apparatus, cause the apparatus to perform the aforementioned methods as well as those described elsewhere herein; a computer program product embodied on a computer-readable storage medium comprising code for performing the aforementioned methods as well as those described elsewhere herein; and/or an apparatus comprising means for performing the aforementioned methods as well as those described elsewhere herein. By way of example, an apparatus may comprise a processing system, a device with a processing system, or processing systems cooperating over one or more networks.

The following description and the appended figures set forth certain features for purposes of illustration.

BRIEF DESCRIPTION OF DRAWINGS

The appended figures depict certain features of the various aspects described herein and are not to be considered limiting of the scope of this disclosure.

DETAILED DESCRIPTION

Figure 1:
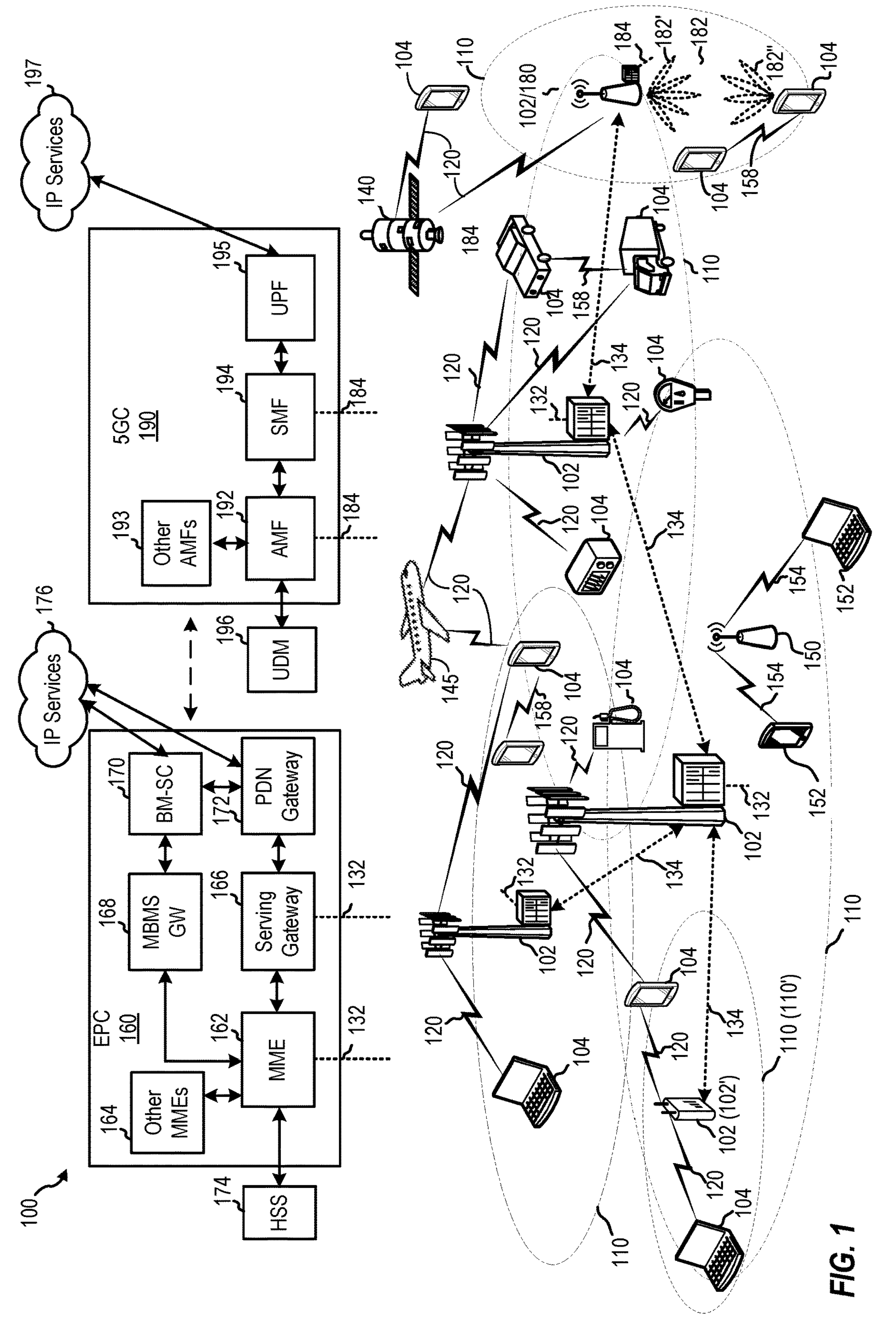
FIG. 1 depicts an example wireless communications network.

Aspects of the present disclosure provide apparatuses, methods, processing systems, and computer-readable mediums for data compression and channel coding techniques for variable length payloads.

In some cases, data compression techniques may be used to reduce overhead when wirelessly transmitting data. Certain applications may require lossless compression, which preserves all information within a source payload without sacrificing accuracy. One such lossless compression technique includes Huffman code data compression, which assigns shorter codes to more frequently occurring symbols and longer codes to less frequent symbols. For example, this technique exploits the principle of entropy, where symbols with higher probabilities are represented by shorter bit sequences, resulting in overall compression of data of the source payload.

However, these compression techniques may result in a variable length compressed payload, which may cause issues with decoding the compressed payload at a receiver device. For example, since the output of these compression techniques results in a variable length compressed payload, if a transmitter device were to directly pass the bits of the compressed payload to an encoder to encode the compressed payload for transmission, the receiver device would not know the length of the compressed payload and, thus, would not be able to decode the encoded compressed payload successfully.

Accordingly, aspects of the present disclosure provide techniques that may enable a transmitter device to take advantage of the overhead reduction benefits discussed above associated with variable length compression while helping to avoid the issues discussed above related to a receiver device being unable to decode encoded compressed payloads having a variable length.

For example, in some cases, these techniques may involve a transmitter device compressing a payload having a first length using a variable length compression technique to obtain a compressed payload and then adding a quantity of padding bits to the compressed payload to obtain a padded compressed payload having a second length. In some cases, the second length may be known to a receiver device. After adding the quantity of padding bits, the transmitter device may encode the padded compressed payload before transmitting the encoded padded compressed payload to a receiver device. The receiver device may then use the (known) second length to decode the encoded padded compressed payload to obtain the padded compressed payload. Thereafter, the receiver device may remove the quantity of padding bits to obtain the compressed payload and perform decompression on the compressed payload to obtain bits of the original payload.

While the number of information bits of the padded compressed payload that are passed to the FEC encoder for encoding by the transmitter device may be increased relative to a number of bits of the compressed payload (e.g., due to adding the quality of padding bits), an entropy per information bit reduces allowing the receiver device to improve decoding performance of a decoder of the receiver device. In particular, the padding bits have very small entropy, which can be treated as an “almost-known” bits by a decoder of the receiver device. For example, when receiving an encoded signal from the transmitter device, the receiver device may know with a high probability that that there is some quantity of padding bits (and their respective bit value probabilities) that are included in the encoded padded compressed payload. Accordingly, the decoder of the receiver device may be able to exploit prior information or knowledge of where the padding bits are located in the encoded signal and probabilities of the bit values of the padding bits to improve decoding performance associated with decoding the encoded signal.

Introduction to Wireless Communications Networks

The techniques and methods described herein may be used for various wireless communications networks. While aspects may be described herein using terminology commonly associated with 3G, 4G, and/or 5G wireless technologies, aspects of the present disclosure may likewise be applicable to other communications systems and standards not explicitly mentioned herein.

FIG. 1 depicts an example of a wireless communications network 100, in which aspects described herein may be implemented.

Generally, wireless communications network 100 includes various network entities (alternatively, network elements or network nodes). A network entity is generally a communications device and/or a communications function performed by a communications device (e.g., a user equipment (UE), a base station (BS), a component of a BS, a server, etc.). For example, various functions of a network as well as various devices associated with and interacting with a network may be considered network entities. Further, wireless communications network 100 includes terrestrial aspects, such as ground-based network entities (e.g., BSs 102), and non-terrestrial aspects, such as satellite 140 and aircraft 145, which may include network entities on-board (e.g., one or more BSs) capable of communicating with other network elements (e.g., terrestrial BSs) and user equipments.

In the depicted example, wireless communications network 100 includes BSs 102, UEs 104, and one or more core networks, such as an Evolved Packet Core (EPC) 160 and 5G Core (5GC) network 190, which interoperate to provide communications services over various communications links, including wired and wireless links.

FIG. 1 depicts various example UEs 104, which may more generally include: a cellular phone, smart phone, session initiation protocol (SIP) phone, laptop, personal digital assistant (PDA), satellite radio, global positioning system, multimedia device, video device, digital audio player, camera, game console, tablet, smart device, wearable device, vehicle, electric meter, gas pump, large or small kitchen appliance, healthcare device, implant, sensor/actuator, display, internet of things (IoT) devices, always on (AON) devices, edge processing devices, or other similar devices. UEs 104 may also be referred to more generally as a mobile device, a wireless device, a wireless communications device, a station, a mobile station, a subscriber station, a mobile subscriber station, a mobile unit, a subscriber unit, a wireless unit, a remote unit, a remote device, an access terminal, a mobile terminal, a wireless terminal, a remote terminal, a handset, and others.

BSs 102 wirelessly communicate with (e.g., transmit signals to or receive signals from) UEs 104 via communications links 120. The communications links 120 between BSs 102 and UEs 104 may include uplink (UL) (also referred to as reverse link) transmissions from a UE 104 to a BS 102 and/or downlink (DL) (also referred to as forward link) transmissions from a BS 102 to a UE 104. The communications links 120 may use multiple-input and multiple-output (MIMO) antenna technology, including spatial multiplexing, beamforming, and/or transmit diversity in various aspects.

BSs 102 may generally include: a NodeB, enhanced NodeB (eNB), next generation enhanced NodeB (ng-eNB), next generation NodeB (gNB or gNodeB), access point, base transceiver station, radio base station, radio transceiver, transceiver function, transmission reception point, and/or others. Each of BSs 102 may provide communications coverage for a respective geographic coverage area 110, which may sometimes be referred to as a cell, and which may overlap in some cases (e.g., small cell 102' may have a coverage area 110' that overlaps the coverage area 110 of a macro cell). A BS may, for example, provide communications coverage for a macro cell (covering relatively large geographic area), a pico cell (covering relatively smaller geographic area, such as a sports stadium), a femto cell (relatively smaller geographic area (e.g., a home)), and/or other types of cells.

Figure 2:
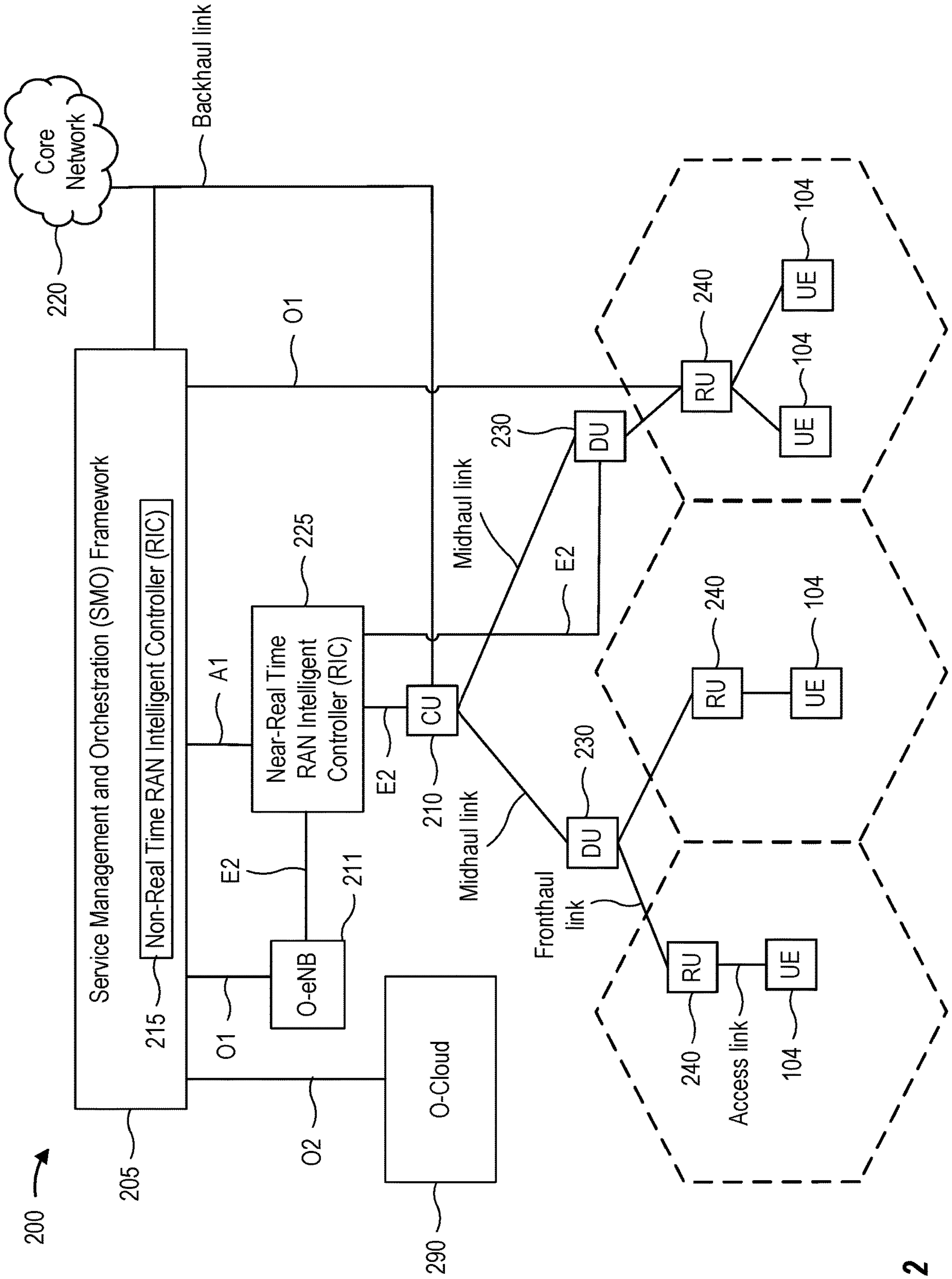
FIG. 2 depicts an example disaggregated base station architecture.

While BSs 102 are depicted in various aspects as unitary communications devices, BSs 102 may be implemented in various configurations. For example, one or more components of a base station may be disaggregated, including a central unit (CU), one or more distributed units (DUs), one or more radio units (RUs), a Near-Real Time (Near-RT) RAN Intelligent Controller (RIC), or a Non-Real Time (Non-RT) RIC, to name a few examples. In another example, various aspects of a base station may be virtualized. More generally, a base station (e.g., BS 102) may include components that are located at a single physical location or components located at various physical locations. In examples in which a base station includes components that are located at various physical locations, the various components may each perform functions such that, collectively, the various components achieve functionality that is similar to a base station that is located at a single physical location. In some aspects, a base station including components that are located at various physical locations may be referred to as a disaggregated radio access network architecture, such as an Open RAN (O-RAN) or Virtualized RAN (VRAN) architecture. FIG. 2 depicts and describes an example disaggregated base station architecture.

Different BSs 102 within wireless communications network 100 may also be configured to support different radio access technologies, such as 3G, 4G, and/or 5G. For example, BSs 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., an S1 interface). BSs 102 configured for 5G (e.g., 5G NR or Next Generation RAN (NG-RAN)) may interface with 5GC 190 through second backhaul links 184. BSs 102 may communicate directly or indirectly (e.g., through the EPC 160 or 5GC 190) with each other over third backhaul links 134 (e.g., X2 interface), which may be wired or wireless.

Wireless communications network 100 may subdivide the electromagnetic spectrum into various classes, bands, channels, or other features. In some aspects, the subdivision is provided based on wavelength and frequency, where frequency may also be referred to as a carrier, a subcarrier, a frequency channel, a tone, or a subband. For example, 3GPP currently defines Frequency Range 1 (FR1) as including 410 MHz-7125 MHz, which is often referred to (interchangeably) as “Sub-6 GHz”. Similarly, 3GPP currently defines Frequency Range 2 (FR2) as including 24,250 MHz-71,000 MHz, which is sometimes referred to (interchangeably) as a “millimeter wave” (“mmW” or “mmWave”). In some cases, FR2 may be further defined in terms of sub-ranges, such as a first sub-range FR2-1 including 24,250 MHz-52,600 MHz and a second sub-range FR2-2 including 52,600 MHz-71,000 MHz. A base station configured to communicate using mm Wave/near mm Wave radio frequency bands (e.g., a mmWave base station such as BS 180) may utilize beamforming (e.g., 182) with a UE (e.g., 104) to improve path loss and range.

The communications links 120 between BSs 102 and, for example, UEs 104, may be through one or more carriers, which may have different bandwidths (e.g., 5, 10, 15, 20, 100, 400, and/or other MHz), and which may be aggregated in various aspects. Carriers may or may not be adjacent to each other. Allocation of carriers may be asymmetric with respect to DL and UL (e.g., more or fewer carriers may be allocated for DL than for UL).

Communications using higher frequency bands may have higher path loss and a shorter range compared to lower frequency communications. Accordingly, certain base stations (e.g., 180 in FIG. 1) may utilize beamforming 182 with a UE 104 to improve path loss and range. For example, BS 180 and the UE 104 may each include a plurality of antennas, such as antenna elements, antenna panels, and/or antenna arrays to facilitate the beamforming. In some cases, BS 180 may transmit a beamformed signal to UE 104 in one or more transmit directions 182'. UE 104 may receive the beamformed signal from the BS 180 in one or more receive directions 182". UE 104 may also transmit a beamformed signal to the BS 180 in one or more transmit directions 182". BS 180 may also receive the beamformed signal from UE 104 in one or more receive directions 182'. BS 180 and UE 104 may then perform beam training to determine the best receive and transmit directions for each of BS 180 and UE 104. Notably, the transmit and receive directions for BS 180 may or may not be the same. Similarly, the transmit and receive directions for UE 104 may or may not be the same.

Wireless communications network 100 further includes a Wi-Fi AP 150 in communication with Wi-Fi stations (STAs) 152 via communications links 154 in, for example, a 2.4 GHz and/or 5 GHz unlicensed frequency spectrum.

Certain UEs 104 may communicate with each other using device-to-device (D2D) communications link 158. D2D communications link 158 may use one or more sidelink channels, such as a physical sidelink broadcast channel (PSBCH), a physical sidelink discovery channel (PSDCH), a physical sidelink shared channel (PSSCH), a physical sidelink control channel (PSCCH), and/or a physical sidelink feedback channel (PSFCH).

EPC 160 may include various functional components, including: a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and/or a Packet Data Network (PDN) Gateway 172, such as in the depicted example. MME 162 may be in communication with a Home Subscriber Server (HSS) 174. MME 162 is the control node that processes the signaling between the UEs 104 and the EPC 160. Generally, MME 162 provides bearer and connection management.

Generally, user Internet protocol (IP) packets are transferred through Serving Gateway 166, which itself is connected to PDN Gateway 172. PDN Gateway 172 provides UE IP address allocation as well as other functions. PDN Gateway 172 and the BM-SC 170 are connected to IP Services 176, which may include, for example, the Internet, an intranet, an IP Multimedia Subsystem (IMS), a Packet Switched (PS) streaming service, and/or other IP services.

BM-SC 170 may provide functions for MBMS user service provisioning and delivery. BM-SC 170 may serve as an entry point for content provider MBMS transmission, may be used to authorize and initiate MBMS Bearer Services within a public land mobile network (PLMN), and/or may be used to schedule MBMS transmissions. MBMS Gateway 168 may be used to distribute MBMS traffic to the BSs 102 belonging to a Multicast Broadcast Single Frequency Network (MBSFN) area broadcasting a particular service, and/or may be responsible for session management (start/stop) and for collecting eMBMS related charging information.

5GC 190 may include various functional components, including: an Access and Mobility Management Function (AMF) 192, other AMFs 193, a Session Management Function (SMF) 194, and a User Plane Function (UPF) 195. AMF 192 may be in communication with Unified Data Management (UDM) 196.

AMF 192 is a control node that processes signaling between UEs 104 and 5GC 190. AMF 192 provides, for example, quality of service (QoS) flow and session management.

Internet protocol (IP) packets are transferred through UPF 195, which is connected to the IP Services 197, and which provides UE IP address allocation as well as other functions for 5GC 190. IP Services 197 may include, for example, the Internet, an intranet, an IMS, a PS streaming service, and/or other IP services.

In various aspects, a network entity or network node can be implemented as an aggregated base station, as a disaggregated base station, a component of a base station, an integrated access and backhaul (IAB) node, a relay node, a sidelink node, to name a few examples.

FIG. 2 depicts an example disaggregated base station 200 architecture. The disaggregated base station 200 architecture may include one or more central units (CUs) 210 that can communicate directly with a core network 220 via a backhaul link, or indirectly with the core network 220 through one or more disaggregated base station units (such as a Near-Real Time (Near-RT) RAN Intelligent Controller (RIC) 225 via an E2 link, or a Non-Real Time (Non-RT) RIC 215 associated with a Service Management and Orchestration (SMO) Framework 205, or both). A CU 210 may communicate with one or more distributed units (DUs) 230 via respective midhaul links, such as an F1 interface. The DUs 230 may communicate with one or more radio units (RUS) 240 via respective fronthaul links. The RUs 240 may communicate with respective UEs 104 via one or more radio frequency (RF) access links. In some implementations, the UE 104 may be simultaneously served by multiple RUs 240.

Each of the units, e.g., the CUS 210, the DUs 230, the RUs 240, as well as the Near-RT RICs 225, the Non-RT RICs 215 and the SMO Framework 205, may include one or more interfaces or be coupled to one or more interfaces configured to receive or transmit signals, data, or information (collectively, signals) via a wired or wireless transmission medium. Each of the units, or an associated processor or controller providing instructions to the communications interfaces of the units, can be configured to communicate with one or more of the other units via the transmission medium. For example, the units can include a wired interface configured to receive or transmit signals over a wired transmission medium to one or more of the other units. Additionally or alternatively, the units can include a wireless interface, which may include a receiver, a transmitter or transceiver (such as a radio frequency (RF) transceiver), configured to receive or transmit signals, or both, over a wireless transmission medium to one or more of the other units.

In some aspects, the CU 210 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 210. The CU 210 may be configured to handle user plane functionality (e.g., Central Unit-User Plane (CU-UP)), control plane functionality (e.g., Central Unit-Control Plane (CU-CP)), or a combination thereof. In some implementations, the CU 210 can be logically split into one or more CU-UP units and one or more CU-CP units. The CU-UP unit can communicate bidirectionally with the CU-CP unit via an interface, such as the E1 interface when implemented in an O-RAN configuration. The CU 210 can be implemented to communicate with the DU 230, as necessary, for network control and signaling.

The DU 230 may correspond to a logical unit that includes one or more base station functions to control the operation of one or more RUs 240. In some aspects, the DU 230 may host one or more of a radio link control (RLC) layer, a medium access control (MAC) layer, and one or more high physical (PHY) layers (such as modules for forward error correction (FEC) encoding and decoding, scrambling, modulation and demodulation, or the like) depending, at least in part, on a functional split, such as those defined by the 3rd Generation Partnership Project (3GPP). In some aspects, the DU 230 may further host one or more low PHY layers. Each layer (or module) can be implemented with an interface configured to communicate signals with other layers (and modules) hosted by the DU 230, or with the control functions hosted by the CU 210.

Lower-layer functionality can be implemented by one or more RUs 240. In some deployments, an RU 240, controlled by a DU 230, may correspond to a logical node that hosts RF processing functions, or low-PHY layer functions (such as performing fast Fourier transform (FFT), inverse FFT (IFFT), digital beamforming, physical random access channel (PRACH) extraction and filtering, or the like), or both, based at least in part on the functional split, such as a lower layer functional split. In such an architecture, the RU(s) 240 can be implemented to handle over the air (OTA) communications with one or more UEs 104. In some implementations, real-time and non-real-time aspects of control and user plane communications with the RU(s) 240 can be controlled by the corresponding DU 230. In some scenarios, this configuration can enable the DU(s) 230 and the CU 210 to be implemented in a cloud-based RAN architecture, such as a vRAN architecture.

The SMO Framework 205 may be configured to support RAN deployment and provisioning of non-virtualized and virtualized network elements. For non-virtualized network elements, the SMO Framework 205 may be configured to support the deployment of dedicated physical resources for RAN coverage requirements which may be managed via an operations and maintenance interface (such as an O1 interface). For virtualized network elements, the SMO Framework 205 may be configured to interact with a cloud computing platform (such as an open cloud (O-Cloud) 290) to perform network element life cycle management (such as to instantiate virtualized network elements) via a cloud computing platform interface (such as an O2 interface). Such virtualized network elements can include, but are not limited to, CUs 210, DUs 230, RUS 240 and Near-RT RICs 225. In some implementations, the SMO Framework 205 can communicate with a hardware aspect of a 4G RAN, such as an open eNB (O-eNB) 211, via an O1 interface. Additionally, in some implementations, the SMO Framework 205 can communicate directly with one or more RUs 240 via an O1 interface. The SMO Framework 205 also may include a Non-RT RIC 215 configured to support functionality of the SMO Framework 205.

The Non-RT RIC 215 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 225. The Non-RT RIC 215 may be coupled to or communicate with (such as via an A1 interface) the Near-RT RIC 225. The Near-RT RIC 225 may be configured to include a logical function that enables near-real-time control and optimization of RAN elements and resources via data collection and actions over an interface (such as via an E2 interface) connecting one or more CUs 210, one or more DUs 230, or both, as well as an O-eNB, with the Near-RT RIC 225.

In some implementations, to generate AI/ML models to be deployed in the Near-RT RIC 225, the Non-RT RIC 215 may receive parameters or external enrichment information from external servers. Such information may be utilized by the Near-RT RIC 225 and may be received at the SMO Framework 205 or the Non-RT RIC 215 from non-network data sources or from network functions. In some examples, the Non-RT RIC 215 or the Near-RT RIC 225 may be configured to tune RAN behavior or performance. For example, the Non-RT RIC 215 may monitor long-term trends and patterns for performance and employ AI/ML models to perform corrective actions through the SMO Framework 205 (such as reconfiguration via O1) or via creation of RAN management policies (such as A1 policies).

Figure 3:
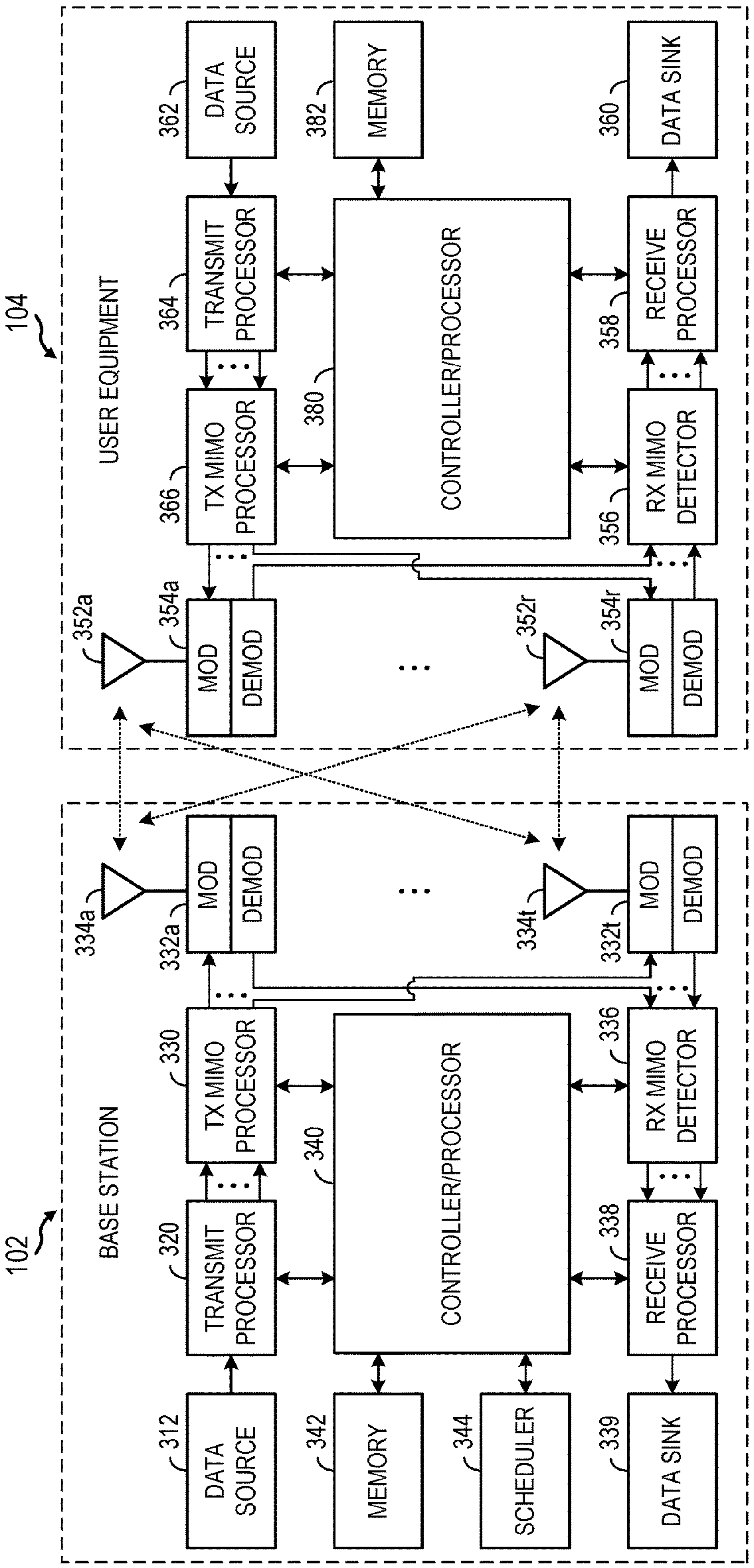
FIG. 3 depicts aspects of an example base station and an example user equipment.

FIG. 3 depicts aspects of an example BS 102 and a UE 104.

Generally, BS 102 includes various processors (e.g., 320, 330, 338, and 340), antennas 334*a-t* (collectively 334), transceivers 332*a-t* (collectively 332), which include modulators and demodulators, and other aspects, which enable wireless transmission of data (e.g., data source 312) and wireless reception of data (e.g., data sink 339). For example, BS 102 may send and receive data between BS 102 and UE 104. BS 102 includes controller/processor 340, which may be configured to implement various functions described herein related to wireless communications.

Generally, UE 104 includes various processors (e.g., 358, 364, 366, and 380), antennas 352*a-r* (collectively 352), transceivers 354*a-r* (collectively 354), which include modulators and demodulators, and other aspects, which enable wireless transmission of data (e.g., retrieved from data source 362) and wireless reception of data (e.g., provided to data sink 360). UE 104 includes controller/processor 380, which may be configured to implement various functions described herein related to wireless communications.

In regards to an example downlink transmission, BS 102 includes a transmit processor 320 that may receive data from a data source 312 and control information from a controller/processor 340. The control information may be for the physical broadcast channel (PBCH), physical control format indicator channel (PCFICH), physical HARQ indicator channel (PHICH), physical downlink control channel (PDCCH), group common PDCCH (GC PDCCH), and/or others. The data may be for the physical downlink shared channel (PDSCH), in some examples.

Transmit processor 320 may process (e.g., encode and symbol map) the data and control information to obtain data symbols and control symbols, respectively. Transmit processor 320 may also generate reference symbols, such as for the primary synchronization signal (PSS), secondary synchronization signal (SSS), PBCH demodulation reference signal (DMRS), and channel state information reference signal (CSI-RS).

Transmit (TX) multiple-input multiple-output (MIMO) processor 330 may perform spatial processing (e.g., precoding) on the data symbols, the control symbols, and/or the reference symbols, if applicable, and may provide output symbol streams to the modulators (MODs) in transceivers 332*a*-332*t*. Each modulator in transceivers 332*a*-332*t* may process a respective output symbol stream to obtain an output sample stream. Each modulator may further process (e.g., convert to analog, amplify, filter, and upconvert) the output sample stream to obtain a downlink signal. Downlink signals from the modulators in transceivers 332*a*-332*t* may be transmitted via the antennas 334*a*-334*t*, respectively.

In order to receive the downlink transmission, UE 104 includes antennas 352*a*-352*r* that may receive the downlink signals from the BS 102 and may provide received signals to the demodulators (DEMODs) in transceivers 354*a*-354*r*, respectively. Each demodulator in transceivers 354*a*-354*r* may condition (e.g., filter, amplify, downconvert, and digitize) a respective received signal to obtain input samples. Each demodulator may further process the input samples to obtain received symbols.

MIMO detector 356 may obtain received symbols from all the demodulators in transceivers 354*a*-354*r*, perform MIMO detection on the received symbols if applicable, and provide detected symbols. Receive processor 358 may process (e.g., demodulate, deinterleave, and decode) the detected symbols, provide decoded data for the UE 104 to a data sink 360, and provide decoded control information to a controller/processor 380.

In regards to an example uplink transmission, UE 104 further includes a transmit processor 364 that may receive and process data (e.g., for the PUSCH) from a data source 362 and control information (e.g., for the physical uplink control channel (PUCCH)) from the controller/processor 380. Transmit processor 364 may also generate reference symbols for a reference signal (e.g., for the sounding reference signal (SRS)). The symbols from the transmit processor 364 may be precoded by a TX MIMO processor 366 if applicable, further processed by the modulators in transceivers 354*a*-354*r* (e.g., for SC-FDM), and transmitted to BS 102.

At BS 102, the uplink signals from UE 104 may be received by antennas 334*a-t*, processed by the demodulators in transceivers 332*a*-332*t*, detected by a MIMO detector 336 if applicable, and further processed by a receive processor 338 to obtain decoded data and control information sent by UE 104. Receive processor 338 may provide the decoded data to a data sink 339 and the decoded control information to the controller/processor 340.

Memories 342 and 382 may store data and program codes for BS 102 and UE 104, respectively.

Scheduler 344 may schedule UEs for data transmission on the downlink and/or uplink.

In various aspects, BS 102 may be described as transmitting and receiving various types of data associated with the methods described herein. In these contexts, "transmitting" may refer to various mechanisms of outputting data, such as outputting data from data source 312, scheduler 344, memory 342, transmit processor 320, controller/processor 340, TX MIMO processor 330, transceivers 332*a-t*, antenna 334*a-t*, and/or other aspects described herein. Similarly, "receiving" may refer to various mechanisms of obtaining data, such as obtaining data from antennas 334*a-t*, transceivers 332*a-t*, RX MIMO detector 336, controller/processor 340, receive processor 338, scheduler 344, memory 342, and/or other aspects described herein.

In various aspects, UE 104 may likewise be described as transmitting and receiving various types of data associated with the methods described herein. In these contexts, "transmitting" may refer to various mechanisms of outputting data, such as outputting data from data source 362, memory 382, transmit processor 364, controller/processor 380, TX MIMO processor 366, transceivers 354*a-t*, antenna 352*a-t*, and/or other aspects described herein. Similarly, "receiving" may refer to various mechanisms of obtaining data, such as obtaining data from antennas 352*a-t*, transceivers 354*a-t*, RX MIMO detector 356, controller/processor 380, receive processor 358, memory 382, and/or other aspects described herein.

In some aspects, one or more processors may be configured to perform various operations, such as those associated with the methods described herein, and transmit (output) to or receive (obtain) data from another interface that is configured to transmit or receive, respectively, the data.

FIGS. 4A, 4B, 4C, and 4D depict aspects of data structures for a wireless communications network, such as wireless communications network 100 of FIG. 1.

Figures 4A, 4B, 4C, 4D:
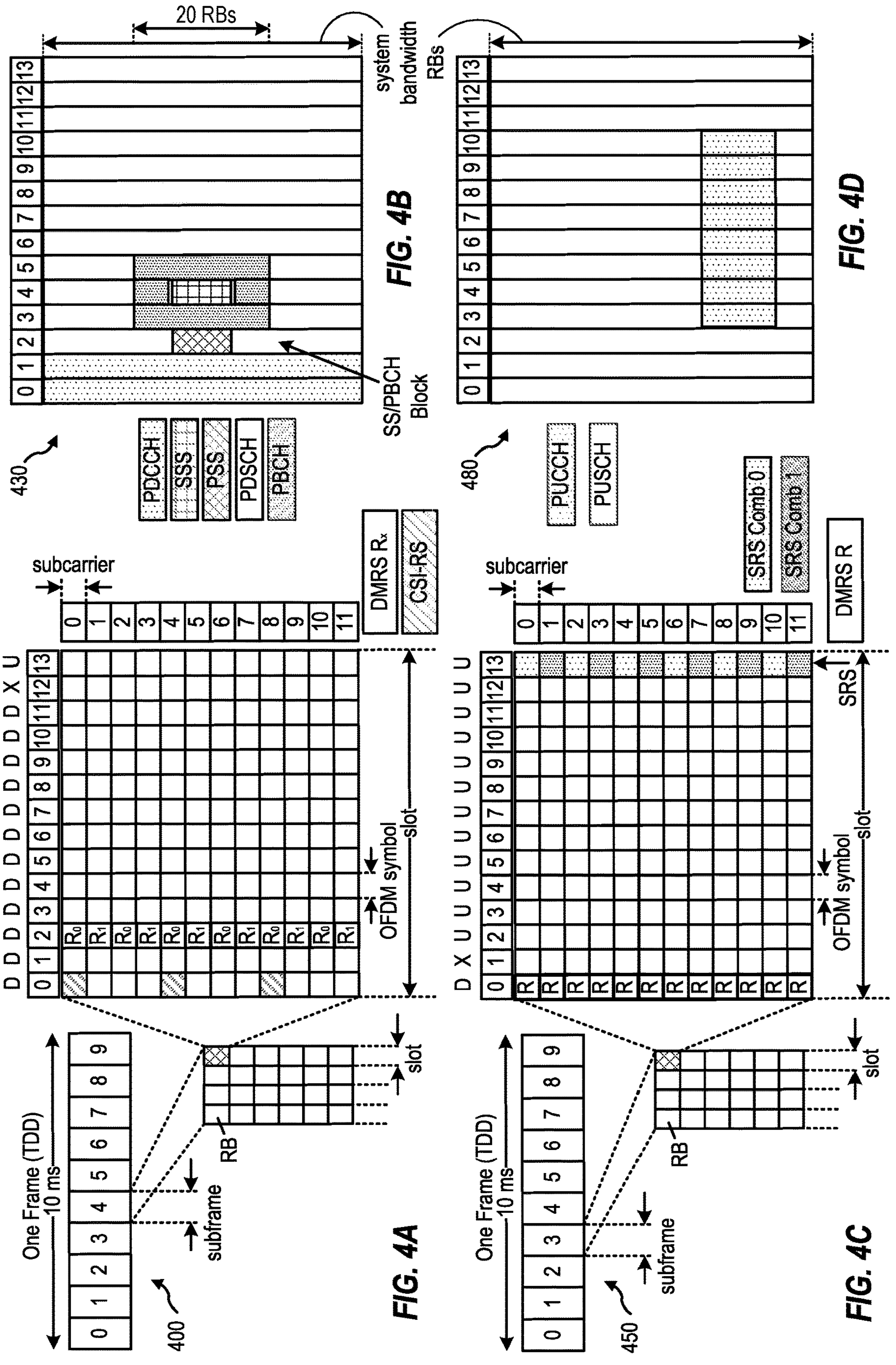
FIGS. 4A, 4B, 4C, and 4D depict various example aspects of data structures for a wireless communications network.

In particular, FIG. 4A is a diagram 400 illustrating an example of a first subframe within a 5G (e.g., 5G NR) frame structure, FIG. 4B is a diagram 430 illustrating an example of DL channels within a 5G subframe, FIG. 4C is a diagram 450 illustrating an example of a second subframe within a 5G frame structure, and FIG. 4D is a diagram 480 illustrating an example of UL channels within a 5G subframe.

Wireless communications systems may utilize orthogonal frequency division multiplexing (OFDM) with a cyclic prefix (CP) on the uplink and downlink. Such systems may also support half-duplex operation using time division duplexing (TDD). OFDM and single-carrier frequency division multiplexing (SC-FDM) partition the system bandwidth (e.g., as depicted in FIGS. 4B and 4D) into multiple orthogonal subcarriers. Each subcarrier may be modulated with data. Modulation symbols may be sent in the frequency domain with OFDM and/or in the time domain with SC-FDM.

A wireless communications frame structure may be frequency division duplex (FDD), in which, for a particular set of subcarriers, subframes within the set of subcarriers are dedicated for either DL or UL. Wireless communications frame structures may also be time division duplex (TDD), in which, for a particular set of subcarriers, subframes within the set of subcarriers are dedicated for both DL and UL.

In FIGS. 4A and 4C, the wireless communications frame structure is TDD where D is DL, U is UL, and X is flexible for use between DL/UL. UEs may be configured with a slot format through a received slot format indicator (SFI) (dynamically through DL control information (DCI), or semi-statically/statically through radio resource control (RRC) signaling). In the depicted examples, a 10 ms frame is divided into 10 equally sized 1 ms subframes. Each subframe may include one or more time slots. In some examples, each slot may include 7 or 14 symbols, depending on the slot format. Subframes may also include mini-slots, which generally have fewer symbols than an entire slot. Other wireless communications technologies may have a different frame structure and/or different channels.

In certain aspects, the number of slots within a subframe is based on a slot configuration and a numerology. For example, for slot configuration 0, different numerologies (μ) 0 to 6 allow for 1, 2, 4, 8, 16, 32, and 64 slots, respectively, per subframe. For slot configuration 1, different numerologies 0 to 2 allow for 2, 4, and 8 slots, respectively, per subframe. Accordingly, for slot configuration 0 and numerology μ, there are 14 symbols/slot and 2μ slots/subframe. The subcarrier spacing and symbol length/duration are a function of the numerology. The subcarrier spacing may be equal to $2^{\mu}\times15$ kHz, where μ is the numerology 0 to 6. As such, the numerology μ=0 has a subcarrier spacing of 15 kHz and the numerology μ=6 has a subcarrier spacing of 960 kHz. The symbol length/duration is inversely related to the subcarrier spacing. FIGS. 4A, 4B, 4C, and 4D provide an example of slot configuration 0 with 14 symbols per slot and numerology μ=2 with 4 slots per subframe. The slot duration is 0.25 ms, the subcarrier spacing is 60 kHz, and the symbol duration is approximately 16.67 μs.

As depicted in FIGS. 4A, 4B, 4C, and 4D, a resource grid may be used to represent the frame structure. Each time slot includes a resource block (RB) (also referred to as physical RBs (PRBs)) that extends, for example, 12 consecutive subcarriers. The resource grid is divided into multiple resource elements (REs). The number of bits carried by each RE depends on the modulation scheme.

As illustrated in FIG. 4A, some of the REs carry reference (pilot) signals (RS) for a UE (e.g., UE 104 of FIGS. 1 and 3). The RS may include demodulation RS (DMRS) and/or channel state information reference signals (CSI-RS) for channel estimation at the UE. The RS may also include beam measurement RS (BRS), beam refinement RS (BRRS), and/or phase tracking RS (PT-RS).

FIG. 4B illustrates an example of various DL channels within a subframe of a frame. The physical downlink control channel (PDCCH) carries DCI within one or more control channel elements (CCEs), each CCE including, for example, nine RE groups (REGs), each REG including, for example, four consecutive REs in an OFDM symbol.

A primary synchronization signal (PSS) may be within symbol 2 of particular subframes of a frame. The PSS is used by a UE (e.g., 104 of FIGS. 1 and 3) to determine subframe/symbol timing and a physical layer identity.

A secondary synchronization signal (SSS) may be within symbol 4 of particular subframes of a frame. The SSS is used by a UE to determine a physical layer cell identity group number and radio frame timing.

Based on the physical layer identity and the physical layer cell identity group number, the UE can determine a physical cell identifier (PCI). Based on the PCI, the UE can determine the locations of the aforementioned DMRS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and/or paging messages.

As illustrated in FIG. 4C, some of the REs carry DMRS (indicated as R for one particular configuration, but other DMRS configurations are possible) for channel estimation at the base station. The UE may transmit DMRS for the PUCCH and DMRS for the PUSCH. The PUSCH DMRS may be transmitted, for example, in the first one or two symbols of the PUSCH. The PUCCH DMRS may be transmitted in different configurations depending on whether short or long PUCCHs are transmitted and depending on the particular PUCCH format used. UE 104 may transmit sounding reference signals (SRS). The SRS may be transmitted, for example, in the last symbol of a subframe. The SRS may have a comb structure, and a UE may transmit SRS on one of the combs. The SRS may be used by a base station for channel quality estimation to enable frequency-dependent scheduling on the UL.

FIG. 4D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Aspects Related to Channel Coding Techniques for Variable Length Payloads

Non-uniform probability of messages naturally emerges in a physical layer of cellular systems. One such scenario in which this non-uniform probability emerges is with the transmission of acknowledgment (ACK) or negative acknowledgment (NACK) information by a user equipment (UE) to a network entity, such as a base station (BS). For example, transmission of an ACK (bit-0) by the UE is generally more likely than that of an NACK (bit-1). For example, in a scenario where the network entity schedules five physical downlink shared channel (PDSCH) transmissions, the UE may send a 5-bit message indicating HARQ ACK/NACK information in response to the decoding of the PDSCH transmissions. In this scenario, assuming a 10% block error rate (BLER) associated with these PDSCH transmissions, there may be a 10% probability of that the UE transmits a NACK in response to the PDSCH transmissions and a 90% probability that the UE transmits an ACK. Moreover, channel state information (CSI) and channel quality indicator (CQI) exhibit correlation and non-uniformity, evident in both classical (e.g., Type I/II and eType II in New Radio) and Artificial Intelligence/Machine Learning (AL/ML)-based designs.

However, current state-of-the-art codebooks in 5G New Radio that may be used when encoding source information are designed for uniform message probabilities, treating bit values of zero and one as equally likely. These uniformly distributed codebooks, however, may not be efficient from a bandwidth or power perspective when used to encode non-uniform source information, such as the HARQ ACK/NACK information described above. One method to address these inefficiencies may be to use source compression, where redundancies in a source payload may be exploited to achieve compression. Such compression may allow for transmission of a message having a smaller size or payload as compared to the original, non-compressed source payload.

In some cases, certain applications may require lossless source compression or coding, which preserves all information within a source payload without sacrificing accuracy. Examples of lossless source compression techniques may include Huffman code data compression, arithmetic coding data compression, Lempel-Ziv coding data compression, etc., each of which assign shorter codes to more frequently occurring symbols and longer codes to less frequent symbols. For example, Huffman code data compression may exploit the principle of entropy coding, where symbols with higher probabilities are represented by shorter bit sequences, resulting in overall compression of data of the source payload. An example of this type of compression is illustrated below in Table 1.

TABLE 1

| Source Payload | Coded bits | Probability |
|---|---|---|
| 100 | 00 | ¼ |
| 101 | 01 | |
| 111 | 111 | ⅛ |
| 110 | 100 | |
| 010 | 101 | |
| 011 | 1101 | 1/16 |
| 001 | 11000 | 1/32 |
| 000 | 11001 | |

As can be seen in Table 1, symbols 100 and 101 have a probability of occurrence of about ¼ and, as such, may be assigned shorter coded bit sequences, such as 00 and 01, respectively. Conversely, symbols having a lower probability of occurrence, such as 001 and 000 with a probability of 1/32, may be assigned longer coded bit sequences, such as 11000 and 11001, respectively. Since symbols with a higher probability of occurrence are assigned shorter coded bit sequences, this results in an overall reduction in payload size that will be transmitted, thereby reducing overhead and conserving time-frequency resources in a wireless network.

However, as can be seen, these compression techniques result in a variable length compressed payload, which may cause issues with decoding the compressed payload at a receiver device. For example, since the output of these compression techniques results in a variable length compressed payload, if a transmitter device were to directly pass the bits of the compressed payload to a forward error correction (FEC) encoder to encode the compressed payload for transmission, the receiver device would not know the length of the compressed payload and, thus, would not be able to decode the encoded compressed payload successfully.

One manner of alleviating this issue regarding the receiver device not being able to successfully decode an encoded compressed payload having a variable length may be for the transmitter device to simply indicate the length of the compressed payload. However, this may not be convenient for uplink transmissions where a resource allocation for transmissions is controlled by a network entity (e.g., the receiver device for uplink transmissions). For example, in order to even be able to indicate to the network entity/receiver device the size of a variable length compressed payload in an encoded uplink transmission, a UE/transmitter device would first have to request resources for transmitting this indication and then would have to request separate resources for transmitting the uplink transmission. As can be seen, such techniques would lead to a two-step approach whereby the length of the variable length compressed payload and the actual variable length compressed payload must be conveyed in different transmissions with separate channel encoding, resulting in an inefficient use of time-frequency resources in a wireless network.

Accordingly, aspects of the present disclosure provide techniques that may enable a transmitter device to take advantage of the overhead reduction benefits discussed above associated with variable length compression while helping to avoid the issues discussed above related to a receiver device being unable to decode encoded compressed payloads having a variable length.

For example, in some cases, these techniques may involve a transmitter device compressing a payload having a first length using a variable length compression technique to obtain a compressed payload and then adding a quantity of padding bits to the compressed payload to obtain a padded compressed payload having a second length. In some cases, the second length may be a maximum payload length ($K_{max}$) or some other pre-defined length. In general, the second length may be longer than the first length unless the first length is already the maximum payload length ($K_{max}$), in which case no padding bits may be added. It should be appreciated that regardless of the particular quantity of padding bits that are added, all padded compressed payloads that are transmitted by the transmitter device may have an equal length, which may be known to a receiver device.

After adding the quantity of padding bits, the padded compressed payload, having $K_{max}$ information bits, may then be encoded, by an FEC encoder of the transmitter device, using an FEC channel code associated with the second length. For example, the FEC channel code may have a size of ($K_{max}$, N) resulting in an encoded padded compressed payload or codeword of length N. Thereafter, the encoded padded compressed payload may be transmitted to the receiver device. The receiver device may then use the second length or maximum payload length ($K_{max}$) to decode the encoded padded compressed payload to obtain the padded compressed payload. Thereafter, the receiver device may remove the quantity of padding bits to obtain the compressed payload and perform decompression on the compressed payload to obtain bits of the original payload. Additional details regarding the operations performed by the receiver device for receiving, decoding, and decompressing an encoded padded compressed payload are described below.

It should be appreciated that although the number of information bits of the padded compressed payload that are passed to the FEC encoder for encoding by the transmitter device may be increased relative to a number of bits of the compressed payload (e.g., due to adding the quality of padding bits), an entropy per information bit reduces allowing the receiver device to improve decoding performance of a decoder of the receiver device. In particular, the padding bits have very small entropy, which can be treated as an "almost-known" bits by a decoder of the receiver device. For example, when receiving an encoded signal from the transmitter device, the receiver device may know with a high probability that that there is some quantity of padding bits (and their respective bit value probabilities) that are included in the encoded padded compressed payload. Accordingly, the decoder of the receiver device may be able to exploit prior information or knowledge of where the padding bits are located in the encoded signal and probabilities of the bit values of the padding bits to improve decoding performance associated with decoding the encoded signal.

In some cases, the manner of adding the quantity of padding bits to the compressed payload may be performed in different manners, as shown in Table 2 below. It should be appreciated that the examples shown in Table 2 assume a maximum payload length of five bits.

TABLE 2

| Source Payload | Coded bits | Codebook (pre-padding) | Codebook (post-padding |
|---|---|---|---|
| 100 | 00 | **000**00 | 00**000** |
| 101 | 01 | **000**01 | 01**000** |
| 111 | 111 | **00**111 | 111**00** |
| 110 | 100 | **00**100 | 100**00** |
| 010 | 101 | **00**101 | 101**00** |
| 011 | 1101 | **0**1101 | 1101**0** |
| 001 | 11000 | 11000 | 11000 |
| 000 | 11001 | 11001 | 11001 |

For example, column 1 of Table 2 illustrates a set of different payloads that may compressed using a variable length compression technique and column 2 of Table 2 illustrates a corresponding set of different variable length compressed payloads that may be output by the variable length compression technique based on the different payloads. Columns 3 and 4 of Table 2 illustrate different codebooks for different methods of adding the quantity of padding bits to the compressed payloads.

For example, in the third column of Table 2, a first manner of adding the quantity of padding bits to a compressed payload may be referred to as "pre-padding" and may involve adding the quantity of padding bits before a starting bit of the compressed payload. For example, as shown in the third row of Table 2, a payload of 101 may be compressed to obtain a compressed payload having a set of compressed payload bits (e.g., coded bits) equal to 01. In this example, the set of compressed payload bits (e.g., 01) has a starting bit equal to 0 and an ending bit equal to 1. It should be appreciated that the starting bit comprises a bit of the set of compressed payload bits that is encoded before the ending bit and the ending bit comprises a bit of the set of compressed payload bits that is encoded after the starting bit. In other words, the starting bit in this example is equal to 0 since this bit is in a first bit position of the compressed payload and, thus, is the bit of the set of compressed payload bits that will be encoded first. Similarly, the ending bit in this example is equal to 1 since this bit is in a last bit position of the compressed payload and, thus, in the bit of the set of compressed payload bits that will be encoded last.

Accordingly, when using pre-padding, the transmitter device may add the quantity of padding bits (e.g., shown in Table 2 as the bolded and underline zeros) to the compressed payload before the starting bit of 1, resulting in a padded compressed payload or "codeword" equal to 00001. Alternatively, when using post-padding, the transmitter device may add the quantity of padding bits to the compressed payload after the ending bit of 0, resulting in a padded compressed payload or "codeword" equal to 01000.

In some cases, post-padding may be preferable, for example, for Huffman code data compression. For example, post-padding may be preferable for Huffman code data compression as Huffman code is a prefix code, hence it may be reduce complexity of decompression of the compressed payload at a receiver device if starting decompression at the actual compressed payload rather than the quantity of padding bits. Additionally, using post-padding to add the quantity of padding bits to the end of the compressed payload may result in strong separation in terms of bit entropy, which may improve decoding efficiency of a decoder of the receiver device. In some cases, pre-padding may be preferable for other data compression schemes.

Figure 5:
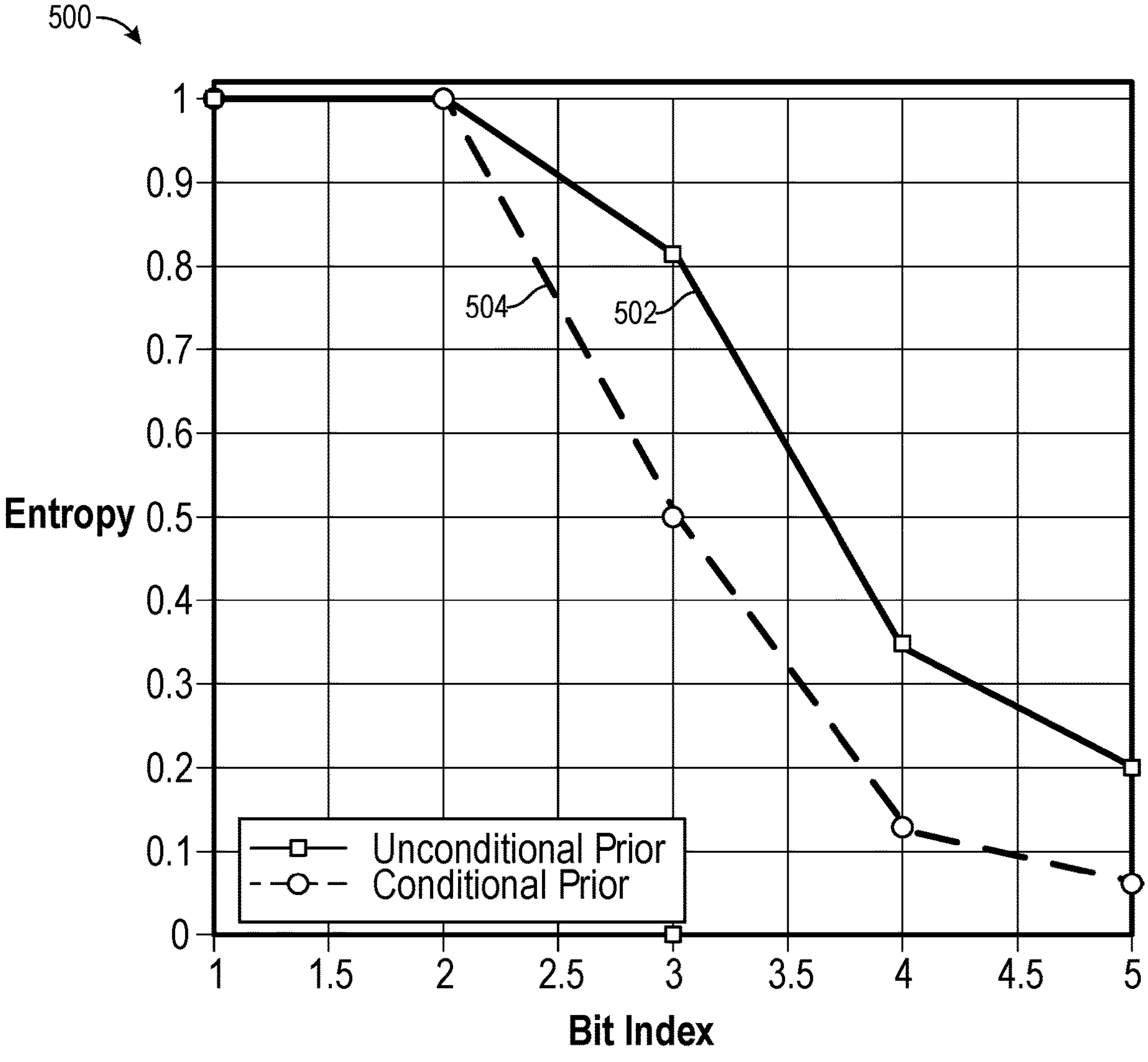
FIG. 5 includes a line graph illustrating an unconditional bit-level entropy and conditional bit-level entropy.

FIG. 5 includes a line graph 500 illustrating an unconditional bit-level entropy 502 (e.g., $H(b_i)$) and conditional bit-level entropy 504 (e.g., $H(b_i|b_1, \ldots, b_{i-1})$) for the post-padding example shown in column 4 of Table 2, above. More specifically, FIG. 5 illustrates the unconditional bit-level entropy 502 and conditional bit-level entropy 504 associated with each bit of the post-padded compressed payloads shown in column 4 of Table 2, where each bit is associated with a respective bit index starting from bit index $b_1$ of the left-most bit of the post-padded compressed payload and ending with bit index $b_n$ of the right-most bit of the post-padded compressed payload. For example, given the post-padded compressed payload of 11100 illustrated in the fourth row of the fourth column of Table 2, the left-most bit 1 is associated with the bit index of $b_1$ while the right-most bit 0 is associated with the bit index of $b_n$. It should be appreciated that the maximum payload length of Table 2 is five bits, n in the bit index of $b_n$ is 5.

It should be appreciated bit-level entropy refers to an amount of uncertainty or randomness present in individual bits of data. As such, the unconditional bit-level entropy 502, also referred to as unconditional "prior" information, measures the entropy of a single bit without considering any context or dependence on other bits. In other words, the unconditional bit-level entropy 502 is similar to looking at each bit in isolation and calculating how much uncertainty it carries. On the other hand, conditional bit-level entropy 504, also referred to as conditional "prior" information, takes into account the context or dependence on neighboring bits, measuring the entropy of a bit given the values of neighboring bits. In other words, the conditional bit-level entropy 504 evaluates the uncertainty of a bit when you know the values of other bits around it.

As shown in FIG. 5, the conditional bit-level entropy 504 varies significantly among the different whole-number bit indices. For example, the first two bits (e.g., bit indices 1 and 2) are uniform (e.g., having an equal probability of being 0 or 1) while the remaining three bits have lower entropy. For example, as shown, the first two bits each have an entropy of 1, meaning they are equally likely to have a value of 0 or 1. In contrast, the conditional bit-level entropy 504 of the remaining bits drops significantly as the bit index increases, meaning that the probability of these bits having a particular value is higher.

For example, if a receiver device knows the first two bits of a padded compressed payload (e.g., through joint decoding and decompression), the decoder of the receiver device may use the conditional bit-level entropy of the remaining bits to improve decoding performance of the remaining bits. More specifically, if the receiver device knows the first two bits of the padded compressed payload, the receiver device may know what that values of the remaining bits of the padded compressed payload are with a high probability. That is, the values of the remaining bits may get polarized into either a 1 or close to 0, which may be exploited by a decoder in the receiver device. For example, the receiver device may use this knowledge, also referred to as "prior" information, to reduce decoding complexity.

Table 3, below, provides another example of data compression and post-padding a number padding bits to a compressed payload. More specifically, the example shown in Table 3 illustrates the Huffman data compression of source payloads having four bits ACK/NACK information that are identically and indecently distributed (i.i.d) with a Bernoulli 0.9 distribution, meaning that a probability of a bit having a value of 0 is 0.9 while the probability of the bit having a value of 1 is 0.1.

TABLE 3

| Source Payload | Code Bits |
|---|---|
| 0000 | 0000000000 |
| 0001 | 1010000000 |
| 0010 | 1100000000 |
| 0100 | 1110000000 |
| 1000 | 1000000000 |
| 0011 | 1001110000 |
| 0101 | 1001011000 |
| 0110 | 1001010000 |
| 1001 | 1001001000 |
| 1010 | 1001000000 |
| 1100 | 1001100000 |
| 0111 | 1001101000 |
| 1011 | 1001101110 |
| 1101 | 1001101100 |
| 1110 | 1001101010 |
| 1111 | 1001101001 |

As shown, the four ACK/NACK bits of the source payload may be compressed to obtain a compressed payload (e.g., code bits) and a quantity of padding bits (e.g., illustrated in Table 3 as the padded and underlines zeros) may be added until a maximum payload length is achieved. In the example shown in Table 3, the maximum payload length is ten bits.

Figure 6:
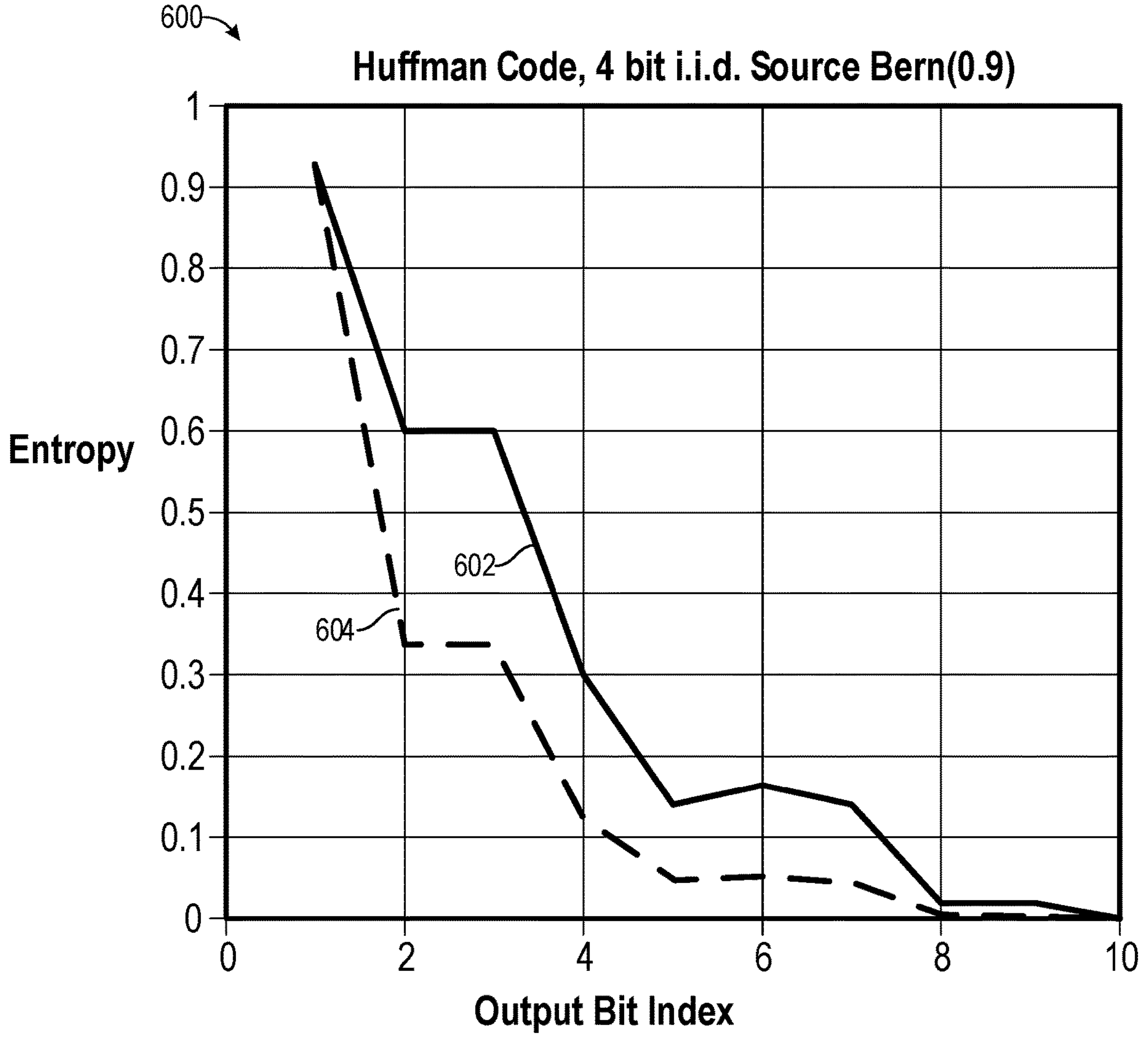
FIG. 6 includes another line graph illustrating an unconditional bit-level entropy and conditional bit-level entropy.

FIG. 6 includes a line graph 600 illustrating an unconditional bit-level entropy 602 (e.g., $H(b_i)$) and conditional bit-level entropy 604 (e.g., $H(b_i|b_1, \ldots, b_{i-1})$) for the post-padding example shown in Table 3. As shown, the first bit of the compressed payload (e.g., code bits) has a high entropy, meaning that this bit may have an equal probability of it having a value of 0 or 1. However, as can be seen, all of the remaining bits have a low entropy. In particular, the remaining bits having an entropy close to zero are essentially known and there is no randomness in the values of these bits. In other words, once the value of the first few bits of the compressed payload is known, the values of the remaining bits are deterministic, which significantly reduces decoding complexity at the receiver device.

As noted above, the receiver device may receive a padded compressed payload from the transmitter device, which may be encoded using a Polar code, a Reed Muller code, an LDPC code, or a Turbo code. In some cases, the encoded padded compressed payload includes a padded compressed payload having a maximum payload length and comprises a set of information bits including the set of compressed payload bits and a quantity of padding bits. Thereafter, the receiver device may decode the encoded padded compressed payload to obtain the padded compressed payload, remove the quantity of padding bits to obtain the compressed payload, and perform decompression on the compressed payload to obtain the original payload.

In some cases, the receiver device may decode the padded compressed payload based on a set of channel log likelihood ratios (LLRs) and a set of prior LLRs. For example, after receiving the encoded padded compressed payload, the receiver device may demodulate the encoded padded compressed payload to obtain the set of channel LLRs. In some cases, each channel LLR in the set of prior LLRs may correspond to a different respective bit of the set of information bits of the padded compressed payload and indicates a probability of that different respective bit having a particular value taking into account noise of a wireless channel over which that different respective bit is received. For example, the set of channel LLRs may be generated by comparing received signal samples with expected signal values, factoring in the known characteristics of the wireless channel and accounting for noise, to estimate the likelihood of each transmitted symbol.

In contrast, each prior LLR in the set of prior LLRs also corresponds to the different respective bit of the set of information bits and is generated based on a priori information indicating a probability of that different respective bit having a particular value. In other words, the prior LLRs are generated not based on signal samples taking into account characteristics of a wireless channel, such as noise, but based on a prior information (e.g., non-measured information), such as the (un)conditional bit-level entropy or (un) conditional prior information discussed above. For example, given the example relating ACK/NACK information about in which ACK information is transmitted 90% of the time, the receiver device may know in advance that what is likely to be received is an ACK bit. As such, the receiver device may use this "prior" information to generate the set of prior LLRs to improve decoding efficiency.

For example, in some cases, when decoding the encoded padded compressed payload, the receiver device may decode at least a first information bit in the first set of information bits. In some cases, in order to decode the first information bit, the receiver device may be configured to combine a channel LLR of the set of channel LLRs corresponding to the first information bit with a prior LLR of the set of prior LLRs corresponding to the first information bit to obtain a combined LLR or posterior LLR. The receiver device may then decode the first information bit using the combined LLR.

The techniques described above involve the compression and padding of payloads by a transmitter device. However, it is equally important to consider a channel code that will be used to encode the padded compressed payloads. For example, in order to take advantage of the conditional bit-level entropy or conditional prior information that the compression and padding confers, a channel code used to encode the padded compressed payload must allow a decoder of a receiver device to exploit the unconditional prior information when decoding the padded compressed payloads.

For example, in some cases, the channel coding techniques that may be used may include Polar codes, low-density parity check (LDPC) codes, Turbo codes, etc. For example, for Polar codes, a receiver device may be able to use the prior information in a successive cancellation list (SCL) decoder by propagating the prior information associated with bits to other bits through list decoding. For LDPC codes, the prior information about a padded compressed payload to channel log likelihood ratios (LLRs), which can be naturally incorporated in a back propagation (BP) or message passing decoder at the receiver device. A similar technique as that used for LDPC codes may be used for Turbo codes if a message passing decoder is implemented at the receiver device.

In some cases, Polar codes may be suitable for taking advantage of the conditional bit-level entropy or conditional prior information that the compression and padding confers. For example, this may be because the decoder used to decode Polar encoded information is a successive cancellation list (SCL) decoder, which is able to handle the conditional priors (e.g., conditional probabilities) of the input and dependencies of the payloads after compression.

Figure 7:
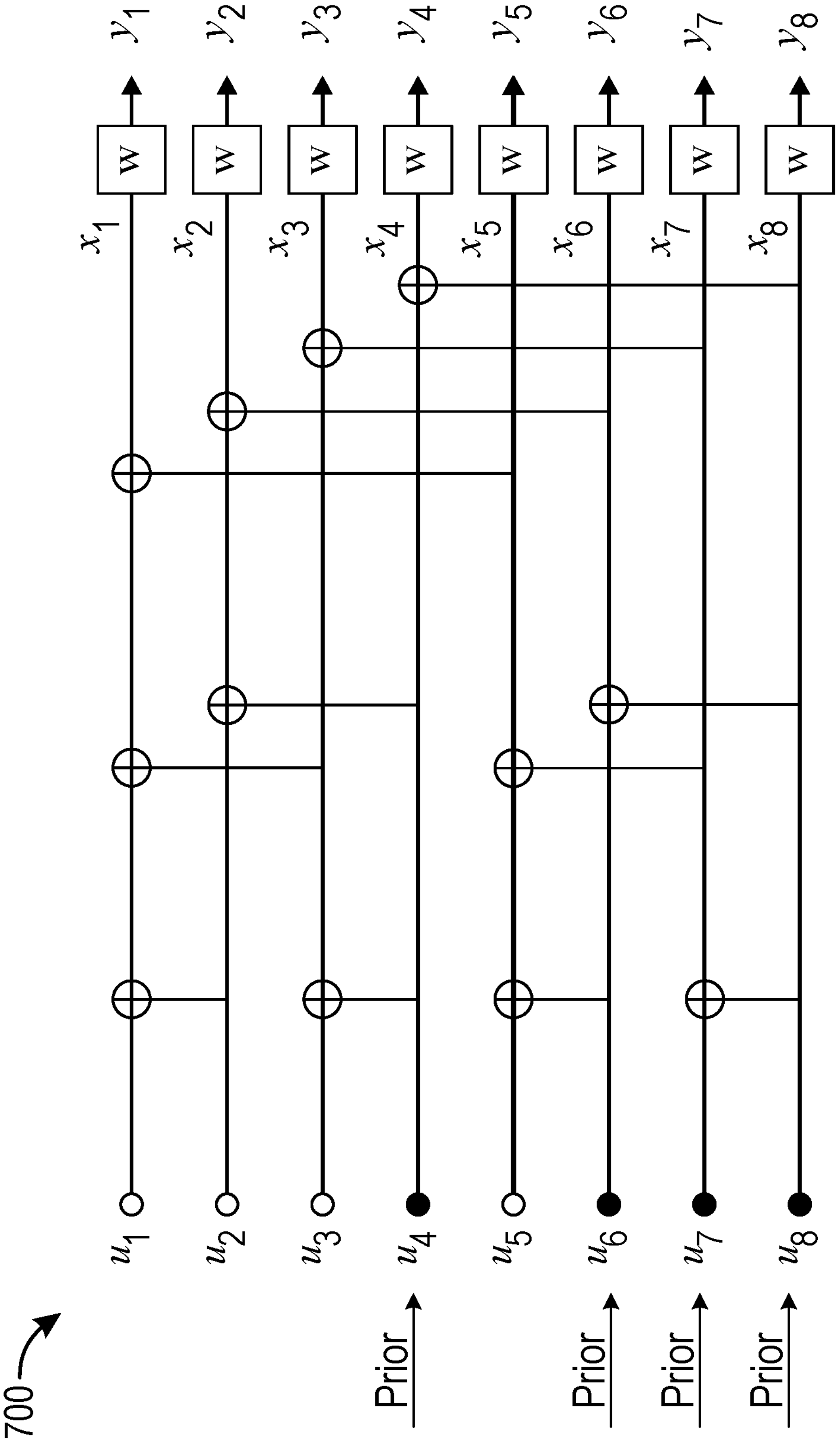
FIG. 7 includes a graph illustrating a Polar encoding and decoding process.

FIG. 7 includes a graph 700 illustrating a Polar encoding and decoding process. Polar encoding operates through a process called polarization, where a set of input bits is transformed into a new set of bits using a polar transform. This transformation selectively enhances or attenuates the reliability of each bit, aiming to maximize the overall communication performance. As the length of the data block increases, the channels' capacities tend to converge to either zero or one, a phenomenon termed polarization. This convergence allows for the identification of reliable and unreliable channels within the communication system.

In the encoding process, the information bits may be transmitted through channels with high reliability, typically those with a capacity close to one. Conversely, channels with low reliability, nearing a capacity of zero, are assigned frozen bits or zeros. For example, in the example shown in FIG. 7, information bits of an encoded padded compressed payload may be assigned to bits $u_4$, $u_6$, $u_7$, and $u_8$ which are transmitted on channels whose capacity is near one while frozen bits may be assigned bits $u_1$, $u_2$, $u_3$, and $u_5$.

On the receiving side, the decoder in the receiving device may receive a Polar encoded signal, including information bits of the encoded padded compressed payload, over a wireless channel, such as $y_1$, $y_2$, $y_3$, $y_4$, $y_5$, $y_6$, $y_7$, and $y_8$ illustrated in FIG. 7. The receiver device may then computes the set of channel LLRs from the received signal and may then sequentially perform decoding on received information bits of the received signal using the computed LLRs. For example, the receiver device may first attempt to decode bit $u_4$ using SCL decoding, knowing the values of bits $u_1$, $u_2$, and $u_3$ are all zero or frozen. After decoding bit $u_4$, the decoder of the receiver device may continue on to decode bit $u_6$, where the decoding result of bit $u_6$ is conditional on the bit value of bit $u_4$. In other words, the information bits assigned to bits $u_4$, $u_6$, $u_7$, and $u_8$ may be decoded one-by-one and, when decoding each information bit is conditioned on the information bits that are "prior" to that particular information bit that is being decoded. In other words, when performing SCL decoding, the decoder may be able to use the probability of $u_i$ given $u_0, \ldots, u_{i-1}$ in the decoding of $u_i$, conditioned on the realization of $u_0, \ldots, u_{i-1}$ in each candidate in the list.

For example, when decoding bit $u_4$, this bit may be a uniform bit, having an equal probability of having a bit value of 0 and a bit value of 1. However, if the decoder of the receiver device has some prior information, for example, the decoder knows that bit $u_4$ is a ACK/NACK bit, the decoder may know that this bit has a large probability of having a bit value of 0 as compared to a bit value of 1. In this case, the decoder may use unconditional prior information when decoding bit $u_4$. For example, the receiver device may calculate a prior LLR according to $$LLR_P = \log\frac{0.9}{0.1}$$

since ACK has a 0.9 probability whereas NACK has a 0.1 probability. The receiver device may then add this prior LLR to the channel LLR for this bit, and then make a hard decision based on the sum of the prior LLR and the channel LLR of this bit to determine a bit value for this bit. In contrast, when decoding bit $u_6$, the receiver device may use conditional prior information to determine the prior LLR for bit $u_6$ conditioned on the value of $u_4$. For example, suppose $u_4$ is decoded to be 0, then the prior LLR of $u_6$ may be set according to:

$$LLR_P = \log\frac{P_v(u_6 = 0 \mid u_4 = 0)}{P_v(u_6 = 1 \mid u_4 = 0)}.$$

As can be seen, when using a Polar decoder, the receiver device is able to exploit the conditional prior information when decoding subsequent information bits, which improved decoding performance as compared to the case where only unconditional prior information is used.

In some cases, for very small (linear) codewords (e.g., 10 bits or less), a maximum a posteriori (MAP) decoder may also be able to incorporate a true prior of each codeword (e.g., overall probability of each codeword, as shown in column 3 of Table 1) when decoding each codeword.

While the techniques presented above are primarily described with respect to Huffman code data compression, it should be appreciated that these techniques may also be used for customized compression algorithms. For example, in some cases, the compressing the payload using the variable length compression technique may generate (1) a first part of the compressed payload having a fixed size and (2) a second part of the compressed payload having a variable size, which may depend on the value of the first part.

Figure 8A:
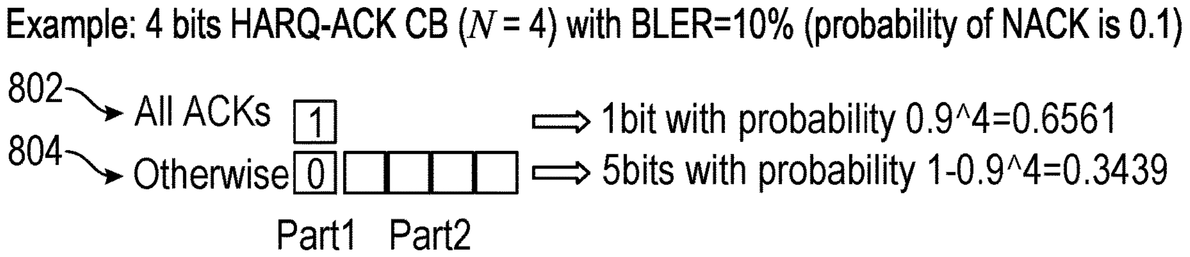
FIG. 8A illustrates an example of a two-part compression technique for acknowledgement information.

For example, FIG. 8A illustrates an example of this two-part compression technique for an ACK/NACK scenario. More specifically, for example, as shown in FIG. 8A, four bits of ACK/NACK information may be compressed and encoded into two parts. The first part may contain only one bit. In the case that the first part includes a bit value of 1, as shown at 802, this may signify that previous transmissions for which the ACK/NACK information is being provided are all ACKs (e.g., these transmission were all successfully received). In this case, the second part would include zero bits—that is, the compressed payload would only include the first part having a single bit. Otherwise, as shown at 804, if the one bit in the first part has a bit value of 0, this may indicate that at least one NACK is included. This this case, the second part may include the ACK/NACK information. The quantity of padding bits may then be added to the second part of the compressed payload by the transmitter device until the second length or maximum payload length is achieved. Thereafter, the first part and the second part may then be concatenated to obtain the padded compressed payload.

Figure 8B:
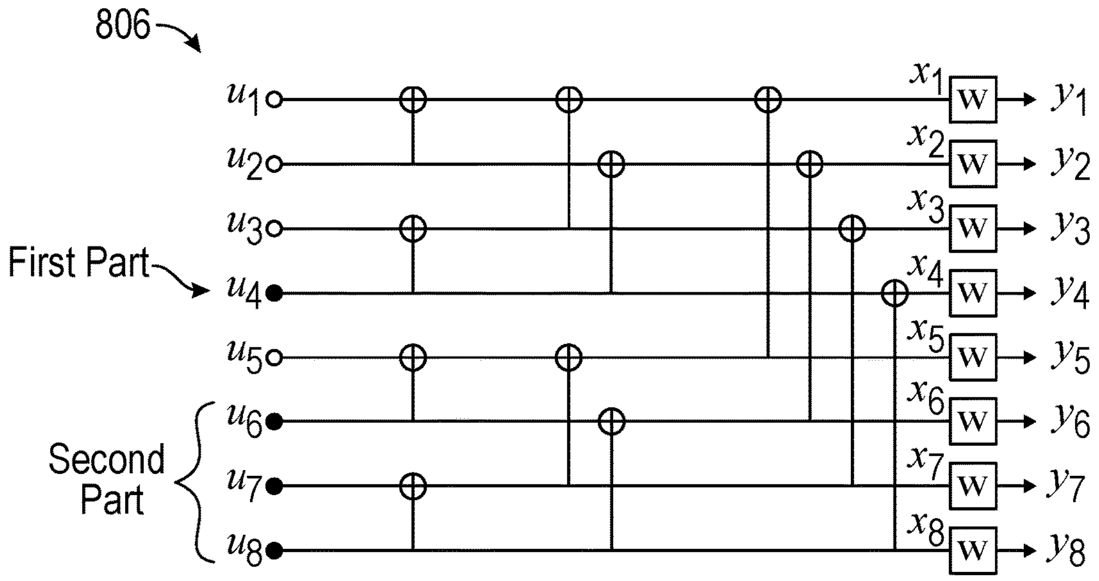
FIG. 8B illustrates mapping a first part of a compressed payload and a second part of the compressed payload to different bit indices of a Polar code.

Thereafter, the first part of the compressed payload and the second part of the compressed payload may be mapped to different bit indices of a Polar code, as shown in FIG. 8B. For example, as illustrated in FIG. 8B, a Polar code 806 may include a first set of information bit indices (e.g., $u_4$, $u_6$, $u_7$, and $u_8$) and a second set of frozen bit indices (e.g., $u_1$, $u_2$, $u_3$, and $u_5$). In some cases, the first part of the compressed payload is mapped to a first subset of information bit indices (e.g., $u_4$) of the first set of information bit indices and the second part of the compressed payload is mapped to a second subset of information bit indices of the first set of information bit indices (e.g., $u_6$, $u_7$, and $u_8$). On the receiving side, the decoder in the receiver device may jointly decode the first part and second part using SCL decoding, and the decoding of the second part depends on the value of the first part.

As can be seen in FIGS. 5 and 6, the bit entropy of a Huffman coded compressed payload decreases as a function of the bit index. This observation also applies to other compression techniques, such as arithmetic coding and other lossless compression techniques. However, sending information bits according to an increasing bit index may not be well-suited for Polar codes. For example, with reference to the graph 700 illustrated in FIG. 7 showing the Polar encoding process, if measuring the channel reliability associated with bits $u_4$, $u_6$, $u_7$, and $u_8$, it is likely that bits $u_4$ and $u_6$ have a lower reliability as compared to bits $u_7$ and $u_8$. As such, if bits of a padded compressed payload are mapped directly to the ascending order of bits $u_4$, $u_6$, $u_7$, and $u_8$, a high entropy bit of the padded compressed payload (e.g., bit index 1 in FIGS. 5 and 6) will be mapped to bit $u_4$ having a low reliability and a low entropy bit (e.g., bit index 4 in FIGS. 5 and 6) will be mapped to bit $u_8$ having a high reliability. In other words, bits that have a low entropy and are essentially "known" are transmitted on channels having high reliability while bits that have high entropy and are "random" or unknown are transmitted on channels having low reliability. This presents an issue since if an unknown first bit is transmitted on the channel having a low reliability, there is a chance that this first bit is improperly received, which may cause all of the subsequent bits to be improperly received if the decoder takes into account conditional prior information for these bits based on the first bit that was improperly received on the low reliability channel.

Accordingly, to help resolve this issue, when a padded compressed payload is encoded using a Polar code, a set of information bits of the padded compressed payload may be mapped to the first set of information bit indices of the Polar code in a reverse order of respective levels of reliability of the information bit indices in the first set of information bit indices. For example, since each bit in the set of information bits has a certain level of entropy, the bits of the set of information bits may be mapped according to their level of entropy in a reverse order of information bit indices of the first set of information bit indices of the Polar code. This reversed order of mapping may thus result in at least (1) a first bit having a lowest entropy in the set of information bits being mapped to a first information bit index having a lowest respective level of reliability in the first set of information bit indices and (2) a second bit having a highest entropy in the set of information bits is mapped to a second information bit index having a highest respective level of reliability in the first set of information bit indices. For example, assuming that the first set of information bit indices includes indices [5, 7, 11, 14, 15] and that a padded compressed payload includes information bits $a_0, a_1, \ldots, a_4$. In this case, the information bits $a_0, a_1, \ldots, a_4$ may be mapped to information bits indices [15, 14, 11, 7, 5], respectively.

Example Operations of a Transmitter Device

Figure 9:
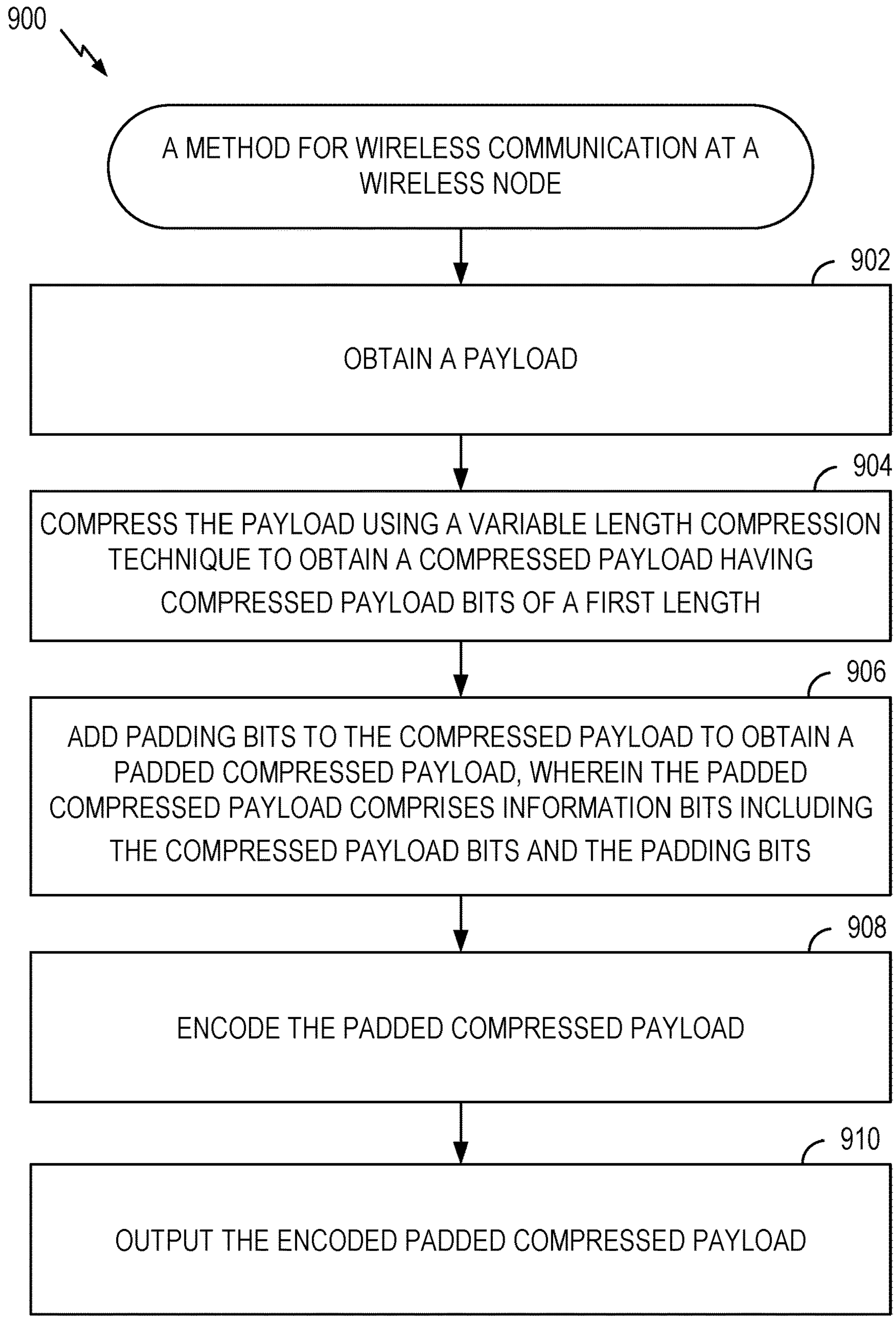
FIG. 9 depicts a method for wireless communications.

FIG. 9 shows a method 900 for wireless communications at a wireless node, such as the transmitter device described above with respect to FIGS. 5, 6, 7, 8A, and 8B. In some cases, the transmitter device may be an example of the BS 102 of FIGS. 1 and 3, a disaggregated base station as discussed with respect to FIG. 2, or the UE 104 of FIGS. 1 and 3.

Method 900 begins at 902 with the transmitter device obtaining a payload for transmission to a receiver device.

Method 900 then proceeds to 904 with the transmitter device compressing the payload using a variable length compression technique to obtain a compressed payload having compressed payload bits of a first length. In some cases, the variable length compression technique may include a data compression algorithm, such as Huffman code data compression described above or another lossless data compression algorithm described herein. As an example, the payload may be compressed using techniques similar to those described above with respect to Table 2 and Table 3.

Method 900 then proceeds to 906 with the transmitter device adding padding bits to the compressed payload to obtain a padded compressed payload. In some cases, the padded compressed payload comprises information bits including the compressed payload bits and the padding bits.

Method 900 then proceeds to 908 with the transmitter device encoding the padded compressed payload. In some cases, encoding the padded compressed pay Method 900 then proceeds to 910 with the transmitter device outputting the encoded padded compressed payload for transmission to the receiver device. In some cases, while not illustrated in FIG. 9, method 900 may further include the transmitter device transmitting the encoded padded compressed payload to the receiver device via a wireless channel.

In some cases, the padded compressed payload has a second length. In some cases, the second length may be longer than the first length. In some cases, the second length may comprise a maximum payload length (e.g., $K_{max}$, described above). In some cases, encoding the padded compressed payload comprises encoding the padded compressed payload using a forward error correction (FEC) code associated with the second length.

In some cases, as described above with respect to Table 2 and Table 3, the compressed payload bits have a starting bit and an ending bit. In some cases, the starting bit comprises a bit of the compressed payload bits that is encoded before the ending bit. In some cases, the ending bit comprises a bit of the compressed payload bits that is encoded after the starting bit. In some cases, in accordance with the techniques described above in relation to the third column of Table 2 (e.g., pre-padding), adding the padding bits to the compressed payload comprises adding the padding bits to compressed payload before the starting bit of set of compressed payload bits. In some cases, in accordance with the techniques described above in relation to the fourth column in Table 2 (e.g., post-padding), adding the padding bits to the compressed payload comprises adding the padding bits to compressed payload after the ending bit of the set of compressed payload bits.

In some cases, the transmitter device may use the techniques described above with respect to FIGS. 8A and 8B to generate a two-part compressed payload. For example, in some cases, compressing the payload using the variable length compression technique to obtain the compressed payload at 904 may include compressing the payload to generate: (1) a first part of the compressed payload having a fixed size and (2) a second part of the compressed payload having a variable size. In some cases, adding the padding bits to the compressed payload at 906 comprises adding the padding bits to the second part of the compressed payload. In some cases, method 900 may also include concatenating the first part of the compressed payload with the second part of the compressed payload to obtain the padded compressed payload. In some cases, the variable size of the second part of the compressed payload depends on a value of one or more bits in the first part of the compressed payload. In some cases, encoding the padded compressed payload at 908 may comprise encoding the padded compressed payload using a Polar code that includes a first set of information bit indices and a second set of frozen bit indices. In some cases, encoding the padded compressed payload at 908 further comprises mapping the first part of the compressed payload to a first subset of information bit indices of the first set of information bit indices and mapping the second part of the compressed payload to a second subset of information bit indices of the first set of information bit indices.

In some cases, the transmitter device may use the techniques described above with respect to at least FIG. 7 to map information bits of the padded compressed payload to information bit indices of a Polar code in a reverse order. For example, in some cases, encoding the padded compressed payload at 908 may include encoding the padded compressed payload using a Polar code. In some cases, the Polar code includes a first set of information bit indices (e.g., $u_4$, $u_6$, $u_7$, and $u_8$, as shown in FIG. 7) and a second set of frozen bit indices (e.g., $u_1$, $u_2$, $u_3$, and $u_5$, as shown in FIG. 7). In some cases, each information bit index in the first set of information bit indices is associated with a respective level of reliability, for example, as illustrated in the line graph 500 of FIG. 5 and the line graph 600 of FIG. 6. In some cases, encoding the padded compressed payload at 908 using the Polar code may include mapping the set of information bits of the padded compressed payload to the first set of information bit indices in a reverse order of respective levels of reliability of the information bit indices in the first set of information bit indices. For example, in some cases, each bit in the set of information bits has a respective level of entropy. In some cases, mapping the set of information bits to the first set of information bit indices in the reverse order of the respective levels of reliability of the information bit indices in the first set of data it indices comprises at least one of: (1) mapping a first bit having a lowest entropy in the set of information bits to a first information bit index having a lowest respective level of reliability in the first set of information bit indices or (2) mapping a second bit having a highest entropy in the set of information bits to a second information bit index having a highest respective level of reliability in the first set of information bit indices.

Figure 11:
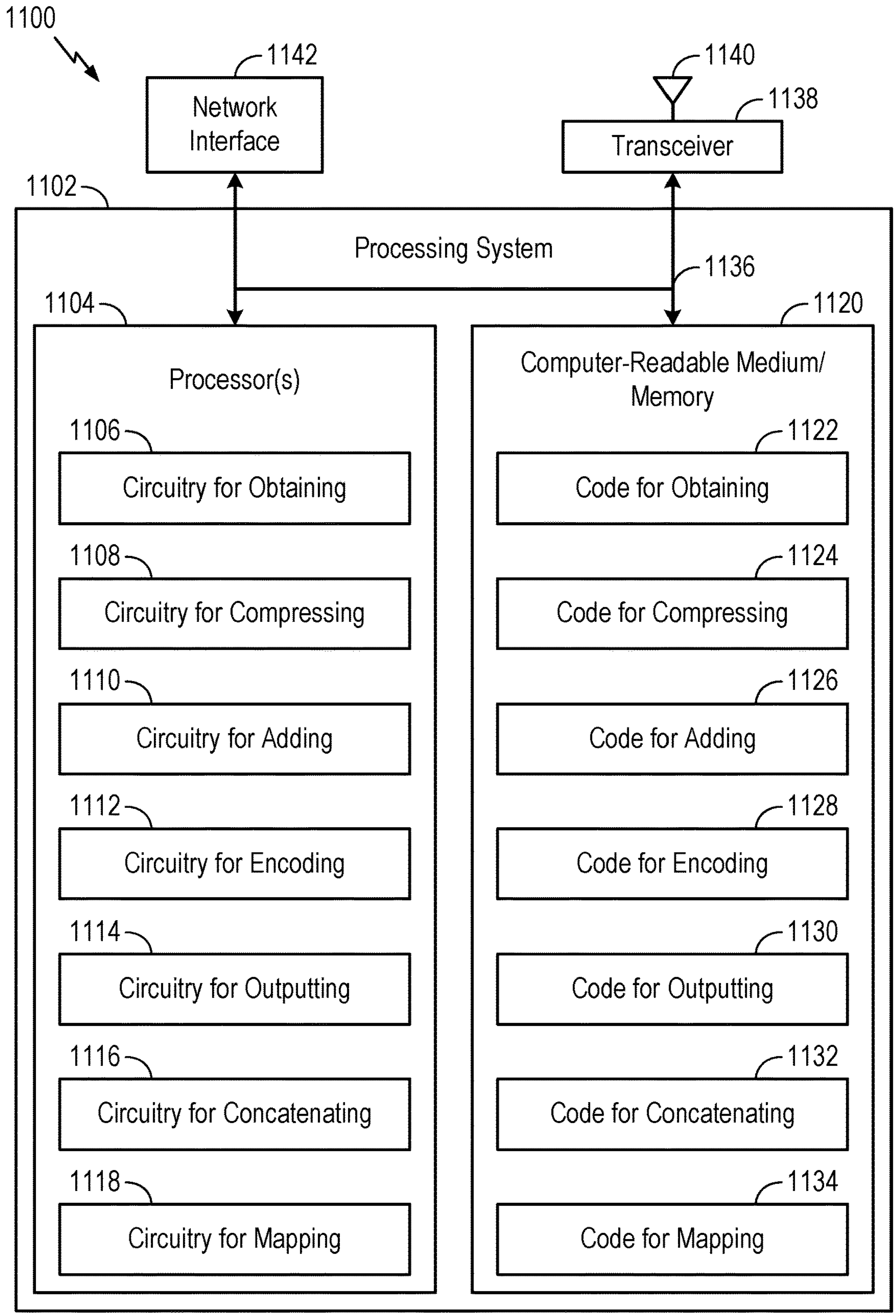
FIG. 11 depicts aspects of an example communications device.

In one aspect, method 900, or any aspect related to it, may be performed by an apparatus, such as communications device 1100 of FIG. 11, which includes various components operable, configured, or adapted to perform the method 900. Communications device 1100 is described below in further detail.

Note that FIG. 9 is just one example of a method, and other methods including fewer, additional, or alternative steps are possible consistent with this disclosure.

Example Operations of a Receiver Device

Figure 10:
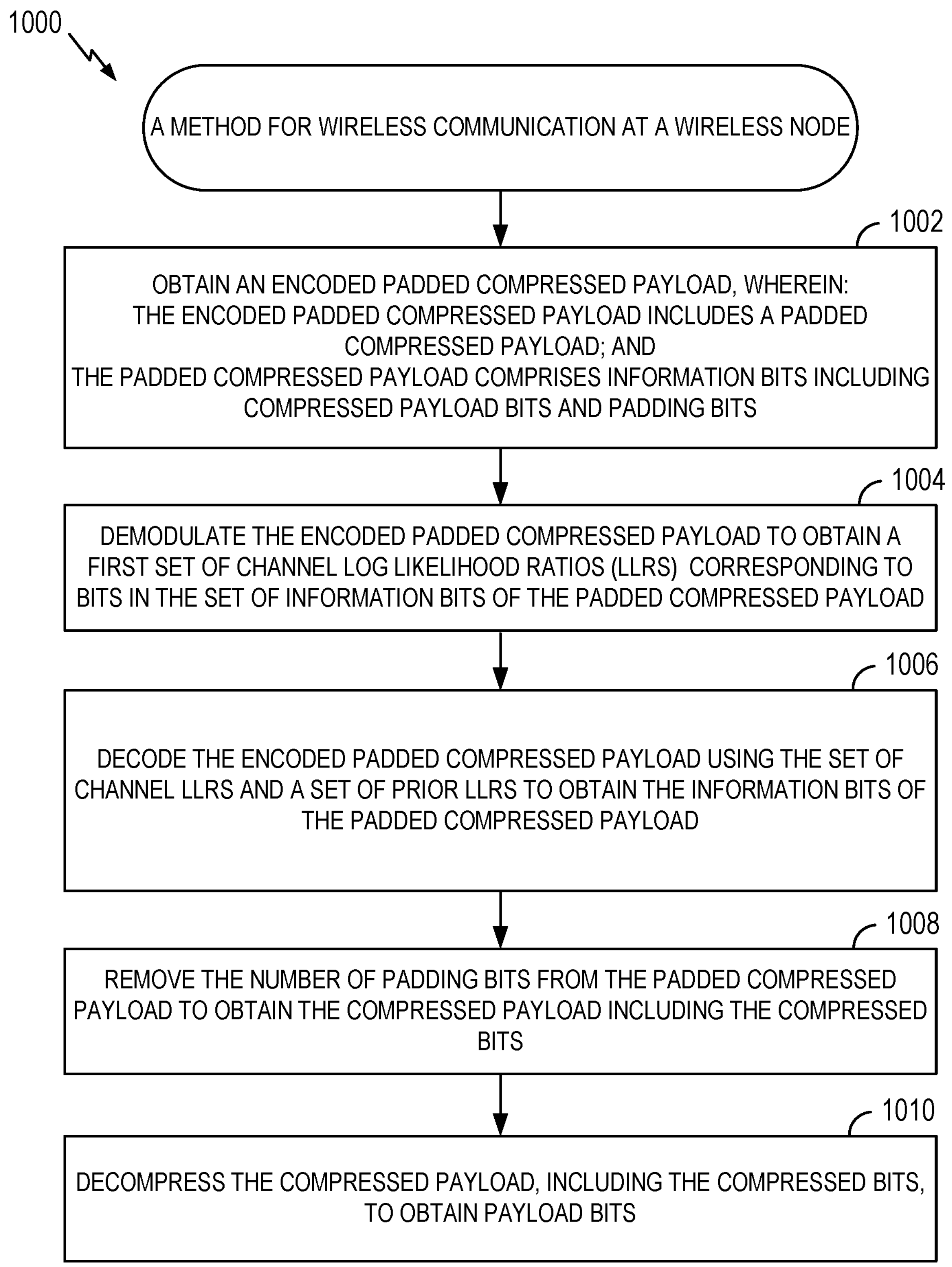
FIG. 10 depicts a method for wireless communications.

FIG. 10 shows a method 1000 for wireless communications at a wireless node, such as the receiver device described above with respect to FIGS. 5, 6, 7, 8A, and 8B. In some cases, the receiver device may be an example of the BS 102 of FIGS. 1 and 3, a disaggregated base station as discussed with respect to FIG. 2, or the UE 104 of FIGS. 1 and 3. In some cases, method 1000 performed by the receiver device may be complementary to method 900 performed by the transmitter device.

Method 1000 begins at 1002 with the receiver device obtaining an encoded padded compressed payload. In some cases, the encoded padded compressed payload includes a padded compressed payload. In some cases, the padded compressed payload comprises information bits including the compressed payload bits and padding bits.

Method 1000 then proceeds to 1004 with the receiver device demodulating the encoded padded compressed payload to obtain a first set of channel log likelihood ratios (LLRs) corresponding to bits in the set of information bits of the padded compressed payload.

Method 1000 then proceeds to 1006 with the receiver device decode the encoded padded compressed payload using the set of channel LLRs and a set of prior LLRs to obtain the set of information bits of the padded compressed payload.

Method 1000 then proceeds to 1008 with the receiver device removing the padding bits from the padded compressed payload to obtain the compressed payload including the compressed payload bits.

Method 1000 then proceeds to 1010 with the receiver device decompressing the compressed payload, including the compressed payload bits, to obtain payload bits.

In some cases, the maximum payload length comprises a maximum payload length.

In some cases, each channel LLR in the set of prior LLRs corresponds to a different respective bit of the set of information bits and indicates a probability of that different respective bit having a particular value taking into account noise of a wireless channel over which that different respective bit is received. In some cases, each prior LLR in the set of prior LLRs corresponds to the different respective bit of the set of information bits and is generated based on a priori information indicating a probability of that different respective bit having a particular value. For example, the set of prior LLRs may be generated using techniques presented above related to the conditional prior information and unconditional prior information described with respect to FIGS. 5 and 6.

In some cases, decoding the encoded padded compressed payload at 1006 may include decoding at least a first information bit in the first set of information bits. In some cases, decoding at least the first information bit may include, as described above, combining a channel LLR of the set of channel LLRs corresponding to the first information bit with a prior LLR of the set of prior LLRs corresponding to the first information bit to obtain a combined LLR (e.g., a posteriori LLR described above). The receiver device may then decode the first information bit using the combined LLR.

In some cases, as described with respect to FIG. 7, decoding the encoded padded compressed payload at 1006 may include decoding the encoded padded compressed payload using successive cancellation list (SCL) decoding. In some cases, decoding the encoded padded compressed payload using SCL decoding may include decoding a subset of information bits of the set of information bits of the padded compressed payload based on channel LLRs in the set of channel LLRs corresponding to the subset of information bits and prior LLRs in the set of prior LLRs corresponding to the subset of information bits. In some cases, the decoded subset of information bits indicates a probability of a bit value of at least one remaining information bit in the subset of information bits. In some cases, decoding the encoded padded compressed payload using SCL decoding further comprises decoding the at least one remaining information bit based, at least in part, on the probability of the bit value of the at least one remaining information bit, for example, using the conditional prior information or unconditional prior information described above.

As noted above, in some cases, the padded compressed payload, included within the encoded padded compressed payload, may include compressed payload bits and padding bits. In some cases, as described above with respect to Table 2 and Table 3, the compressed payload bits has a starting bit and an ending bit. In some cases, the starting bit comprises a bit of the compressed payload bits that is encoded before the ending bit. In some cases, the ending bit comprises a bit of the compressed payload bits that is encoded after the starting bit.

In some cases, in accordance with the techniques described above in relation to the third column of Table 2 (e.g., pre-padding), the padding bits are added in the compressed payload before the starting bit of compressed payload bits. In some cases, in accordance with the techniques described above in relation to the fourth column of Table 2 (e.g., post-padding), the padding bits are added in the compressed payload after the ending bit of the compressed payload bits.

In some cases, in accordance with the techniques described above with respect to FIGS. 8A and 8B, the padded compressed payload comprises a first part of the compressed payload having a fixed size and a second part of the compressed payload having a variable size. In some cases, the padding bits are included in the second part of the compressed payload. In some cases, removing the padding bits from the padded compressed payload at 1008 in FIG. 10 may include removing the padding bits from the second part of the compressed payload in the padded compressed payload. In some cases, the variable size of the second part of the compressed payload depends on a value of one or more bits in the first part of the compressed payload. In some cases, the encoded padded compressed payload, including the padded compressed payload, is encoded based on a Polar code. In some cases, the Polar code includes a first set of information bit indices and a second set of frozen bit indices. In some cases, the first part of the compressed payload is mapped to a first subset of information bit indices of the first set of information bit indices. In some cases, the second part of the compressed payload is mapped to a second subset of information bit indices of the first set of information bit indices.

In some cases, in accordance with the techniques described above with respect to FIG. 7, the encoded padded compressed payload, including the padded compressed payload, is encoded based on a Polar code. In some cases, the Polar code includes a first set of information bit indices (e.g., $u_4$, $u_6$, $u_7$, and $u_8$, as shown in FIG. 7) and a second set of frozen bit indices (e.g., $u_1$, $u_2$, $u_3$, and $u_5$, as shown in FIG. 7). In some cases, each information bit index in the first set of information bit indices is associated with a respective level of reliability. In some cases, the set of information bits of the padded compressed payload are mapped to the first set of information bit indices in a reverse order of respective levels of reliability of the information bit indices in the first set of information bit indices. In some cases, each bit in the set of information bits has a respective level of entropy. In some cases, based on the reverse order, at least one of: (1) a first bit having a lowest entropy in the set of information bits is mapped to a first information bit index having a lowest respective level of reliability in the first set of information bit indices or (2) a second bit having a highest entropy in the set of information bits is mapped to a second information bit index having a highest respective level of reliability in the first set of information bit indices.

Figure 12:
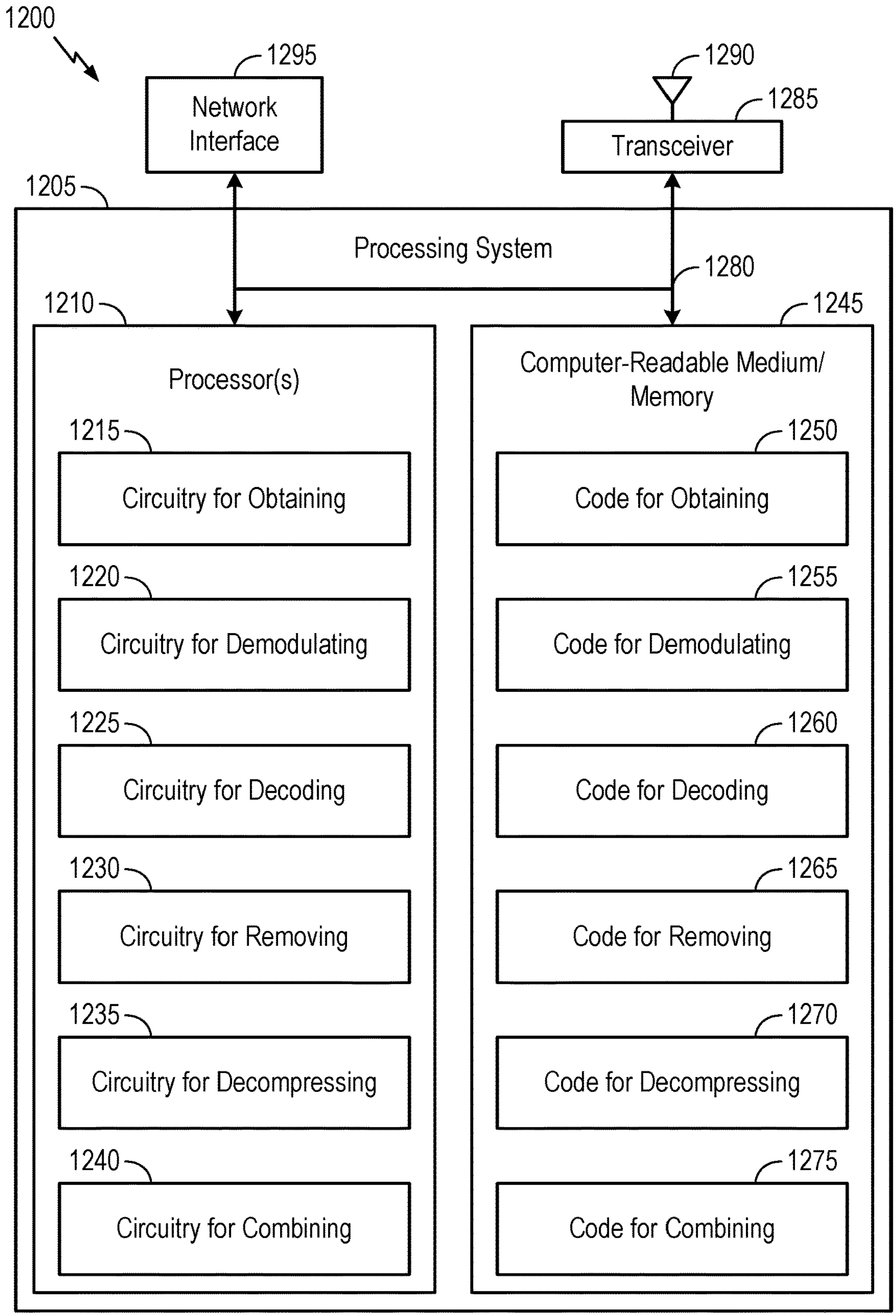
FIG. 12 depicts aspects of an example communications device.

In one aspect, method 1000, or any aspect related to it, may be performed by an apparatus, such as communications device 1200 of FIG. 12, which includes various components operable, configured, or adapted to perform the method 1000. Communications device 1200 is described below in further detail.

Note that FIG. 10 is just one example of a method, and other methods including fewer, additional, or alternative steps are possible consistent with this disclosure.

Example Communications Devices

FIG. 11 depicts aspects of an example communications device 1100. In some aspects, communications device 1100 is a wireless node, such as a transmitter device. For example, in some cases, communications device 1100 is a user equipment, such as UE 104 described above with respect to FIGS. 1 and 3. In some aspects, communications device 1100 is a network entity, such as BS 102 of FIGS. 1 and 3, or a disaggregated base station as discussed with respect to FIG. 2.

The communications device 1100 includes a processing system 1102 coupled to the transceiver 1138 (e.g., a transmitter and/or a receiver). In some aspects (e.g., when communications device 1100 is a network entity), processing system 1102 may be coupled to a network interface 1142 that is configured to obtain and send signals for the communications device 1100 via communication link(s), such as a backhaul link, midhaul link, and/or fronthaul link as described herein, such as with respect to FIG. 2. The transceiver 1138 is configured to transmit and receive signals for the communications device 1100 via the antenna 1140, such as the various signals as described herein. The processing system 1102 may be configured to perform processing functions for the communications device 1100, including processing signals received and/or to be transmitted by the communications device 1100.

The processing system 1102 includes one or more processors 1104. In various aspects, the one or more processors 1104 may be representative of one or more of receive processor 358, transmit processor 364, TX MIMO processor 366, and/or controller/processor 380, as described with respect to FIG. 3. In various aspects, one or more processors 1104 may be representative of one or more of receive processor 338, transmit processor 320, TX MIMO processor 330, and/or controller/processor 340, as described with respect to FIG. 3. The one or more processors 1104 are coupled to a computer-readable medium/memory 1120 via a bus 1136. In certain aspects, the computer-readable medium/memory 1120 is configured to store instructions (e.g., computer-executable code) that when executed by the one or more processors 1104, cause the one or more processors 1104 to perform the method 900 described with respect to FIG. 9, or any aspect related to it. Note that reference to a processor performing a function of communications device 1100 may include one or more processors 1104 performing that function of communications device 1100.

In the depicted example, computer-readable medium/memory 1120 stores code (e.g., executable instructions), such as code for obtaining 1122, code for compressing 1124, code for adding 1126, code for encoding 1128, code for outputting 1130, code for concatenating 1132, and code for mapping 1134. Processing of the code for obtaining 1122, code for compressing 1124, code for adding 1126, code for encoding 1128, code for outputting 1130, code for concatenating 1132, and code for mapping 1134 may cause the communications device 1100 to perform the method 900 described with respect to FIG. 9, or any aspect related to it.

The one or more processors 1104 include circuitry configured to implement (e.g., execute) the code stored in the computer-readable medium/memory 1120, including circuitry for obtaining 1106, circuitry for compressing 1108, circuitry for adding 1110, circuitry for encoding 1112, circuitry for outputting 1114, circuitry for concatenating 1116, and circuitry for mapping 1118. Processing with circuitry for obtaining 1106, circuitry for compressing 1108, circuitry for adding 1110, circuitry for encoding 1112, circuitry for outputting 1114, circuitry for concatenating 1116, and circuitry for mapping 1118 may cause the communications device 1100 to perform the method 900 described with respect to FIG. 9, or any aspect related to it.

Various components of the communications device 1100 may provide means for performing the method 900 described with respect to FIG. 9, or any aspect related to it. For example, means for transmitting, sending or outputting for transmission may include transceivers 354 and/or antenna(s) 352 of the UE 104 illustrated in FIG. 3, transceivers 332 and/or antenna(s) 334 of the BS 102 illustrated in FIG. 3, and/or the transceiver 1138 and the antenna 1140 of the communications device 1100 in FIG. 11. Means for receiving or obtaining may include transceivers 354 and/or antenna(s) 352 of the UE 104 illustrated in FIG. 3, transceivers 332 and/or antenna(s) 334 of the BS 102 illustrated in FIG. 3, and/or the transceiver 1138 and the antenna 1140 of the communications device 1100 in FIG. 11.

FIG. 12 depicts aspects of an example communications device 1200. In some aspects, communications device 1100 is a wireless node, such as a receiver device. For example, in some cases, communications device 1100 is a user equipment, such as UE 104 described above with respect to FIGS. 1 and 3. In some aspects, communications device 1100 is a network entity, such as BS 102 of FIGS. 1 and 3, or a disaggregated base station as discussed with respect to FIG. 2.

The communications device 1200 includes a processing system 1205 coupled to the transceiver 1285 (e.g., a transmitter and/or a receiver). In some aspects (e.g., when communications device 1200 is a network entity), processing system 1205 may be coupled to a network interface 1295 that is configured to obtain and send signals for the communications device 1200 via communication link(s), such as a backhaul link, midhaul link, and/or fronthaul link as described herein, such as with respect to FIG. 2. The transceiver 1285 is configured to transmit and receive signals for the communications device 1200 via the antenna 1290, such as the various signals as described herein. The processing system 1205 may be configured to perform processing functions for the communications device 1200, including processing signals received and/or to be transmitted by the communications device 1200.

The processing system 1205 includes one or more processors 1210. In various aspects, the one or more processors 1210 may be representative of one or more of receive processor 358, transmit processor 364, TX MIMO processor 366, and/or controller/processor 380, as described with respect to FIG. 3. In various aspects, one or more processors 1210 may be representative of one or more of receive processor 338, transmit processor 320, TX MIMO processor 330, and/or controller/processor 340, as described with respect to FIG. 3. The one or more processors 1210 are coupled to a computer-readable medium/memory 1245 via a bus 1280. In certain aspects, the computer-readable medium/memory 1245 is configured to store instructions (e.g., computer-executable code) that when executed by the one or more processors 1210, cause the one or more processors 1210 to perform the method 1000 described with respect to FIG. 10, or any aspect related to it. Note that reference to a processor performing a function of communications device 1200 may include one or more processors 1210 performing that function of communications device 1200.

In the depicted example, computer-readable medium/memory 1245 stores code (e.g., executable instructions), such as code for obtaining 1250, code for demodulating 1255, code for decoding 1260, code for removing 1265, code for decompressing 1270, and code for combining 1275. Processing of the code for obtaining 1250, code for demodulating 1255, code for decoding 1260, code for removing 1265, code for decompressing 1270, and code for combining 1275 may cause the communications device 1200 to perform the method 1000 described with respect to FIG. 10, or any aspect related to it.

The one or more processors 1210 include circuitry configured to implement (e.g., execute) the code stored in the computer-readable medium/memory 1245, including circuitry for obtaining 1215, circuitry for demodulating 1220, circuitry for decoding 1225, circuitry for removing 1230, circuitry for decompressing 1235, and circuitry for combining 1240. Processing with circuitry for obtaining 1215, circuitry for demodulating 1220, circuitry for decoding 1225, circuitry for removing 1230, circuitry for decompressing 1235, and circuitry for combining 1240 may cause the communications device 1200 to perform the method 1000 described with respect to FIG. 10, or any aspect related to it.

Various components of the communications device 1200 may provide means for performing the method 1000 described with respect to FIG. 10, or any aspect related to it. For example, means for transmitting, sending or outputting for transmission may include transceivers 354 and/or antenna(s) 352 of the UE 104 illustrated in FIG. 3, transceivers 332 and/or antenna(s) 334 of the BS 102 illustrated in FIG. 3, and/or the transceiver 1285 and the antenna 1290 of the communications device 1200 in FIG. 12. Means for receiving or obtaining may include transceivers 354 and/or antenna(s) 352 of the UE 104 illustrated in FIG. 3, transceivers 332 and/or antenna(s) 334 of the BS 102 illustrated in FIG. 3, and/or the transceiver 1285 and the antenna 1290 of the communications device 1200 in FIG. 12.

EXAMPLE CLAUSES

Implementation examples are described in the following numbered clauses:

Clause 1: A method for wireless communication at a wireless node, comprising: obtaining a payload; compressing the payload using a variable length technique to obtain a compressed payload having compressed payload bits of a first length; adding padding bits to the compressed payload to obtain a padded compressed payload, wherein the padded compressed payload comprises information bits that include the compressed payload bits and the padding bits; encoding the padded compressed payload; and outputting the encoded padded compressed payload.

Clause 2: The method of Clause 1, wherein: the padded compressed payload has a second length that is longer than the first length; and encoding the padded compressed payload comprises encoding the padded compressed payload using a forward error correction (FEC) code associated with the second length.

Clause 3: The method of Clause 2, wherein the second length comprises a maximum payload length.

Clause 4: The method of any one of Clauses 1-3, wherein the compressed payload bits have a starting bit and an ending bit.

Clause 5: The method of Clause 4, wherein: the starting bit comprises a bit of the compressed payload bits that is encoded before the ending bit; and the ending bit comprises a bit of the compressed payload bits that is encoded after the starting bit.

Clause 6: The method of Clause 5, wherein adding the padding bits to the compressed payload comprises adding the padding bits to compressed payload before the starting bit of compressed payload bits.

Clause 7: The method of Clause 5, wherein adding the padding bits to the compressed payload comprises adding the padding bits to compressed payload after the ending bit of the compressed payload bits.

Clause 8: The method of any one of Clauses 1-7, wherein compressing the payload using the variable length compression technique to obtain the compressed payload comprises: compressing the payload to generate: a first part of the compressed payload having a fixed size; and a second part of the compressed payload having a variable size.

Clause 9: The method of Clause 8, wherein: adding the padding bits to the compressed payload comprises adding the padding bits to the second part of the compressed payload; and the method further comprises concatenating the first part of the compressed payload with the second part of the compressed payload to obtain the padded compressed payload.

Clause 10: The method of Clause 8, wherein the variable size of the second part of the compressed payload depends on a value of one or more bits in the first part of the compressed payload.

Clause 11: The method of Clause 8, wherein: encoding the padded compressed payload comprises encoding the padded compressed payload using a Polar code; and the Polar code includes a first set of information bit indices and a second set of frozen bit indices.

Clause 12: The method of Clause 11, wherein encoding the padded compressed payload comprises: mapping the first part of the compressed payload to a first subset of information bit indices of the first set of information bit indices; and mapping the second part of the compressed payload to a second subset of information bit indices of the first set of information bit indices.

Clause 13: The method of any one of Clauses 1-7, wherein encoding the padded compressed payload comprises encoding the padded compressed payload using a Polar code.

Clause 14: The method of Clause 13, wherein: the Polar code includes a first set of information bit indices and a second set of frozen bit indices; and each information bit index in the first set of information bit indices is associated with a respective level of reliability.

Clause 15: The method of Clause 14, wherein encoding the padded compressed payload using the Polar code comprises mapping the set of information bits of the padded compressed payload to the first set of information bit indices in a reverse order of respective levels of reliability of the information bit indices in the first set of information bit indices.

Clause 16: The method of Clause 15, wherein each bit in the set of information bits has a respective level of entropy.

Clause 17: The method of Clause 16, wherein mapping the set of information bits to the first set of information bit indices in the reverse order of the respective levels of reliability of the information bit indices in the first set of data it indices comprises at least one of: mapping a first bit having a lowest entropy in the set of information bits to a first information bit index having a lowest respective level of reliability in the first set of information bit indices; or mapping a second bit having a highest entropy in the set of information bits to a second information bit index having a highest respective level of reliability in the first set of information bit indices.

Clause 18: A method for wireless communication at a wireless node, comprising: obtaining an encoded padded compressed payload, wherein: the encoded padded compressed payload includes a padded compressed payload, and the padded compressed payload comprises information bits including compressed payload bits and padding bits; demodulating the encoded padded compressed payload to obtain a first set of channel log likelihood ratios (LLRs) corresponding to bits in the set of information bits of the padded compressed payload; decoding the encoded padded compressed payload using the set of channel LLRs and a set of prior LLRs to obtain the information bits of the padded compressed payload; removing the padding bits from the padded compressed payload to obtain the compressed payload including the compressed payload bits; and decompressing the compressed payload, including the compressed payload bits, to obtain payload bits.

Clause 19: The method of Clause 18, wherein the padded compressed payload has a maximum payload length.

Clause 20: The method of any one of Clauses 18-19, wherein: each prior LLR in the set of prior LLRs corresponds to a different respective bit of the set of information bits and is generated based on a priori information indicating a probability of that different respective bit having a particular value; and each different respective bit of the set of information bits also corresponds to a different respective channel LLR in the set of channel LLRs indicating a probability of that different respective bit having a particular value taking into account noise of a wireless channel over which that different respective bit is received.

Clause 21: The method of any one of Clauses 18-20, wherein decoding the encoded padded compressed payload comprises decoding at least a first information bit in the first set of information bits.

Clause 22: The method of Clause 21, wherein decoding at least the first information bit comprises: combining a channel LLR of the set of channel LLRs corresponding to the first information bit with a prior LLR of the set of prior LLRs corresponding to the first information bit to obtain a combined LLR; and decoding the first information bit using the combined LLR.

Clause 23: The method of Clause 21, wherein decoding the encoded padded compressed payload comprises decoding the encoded padded compressed payload using successive cancellation list (SCL) decoding.

Clause 24: The method of Clause 23, wherein decoding the encoded padded compressed payload using SCL decoding comprises decoding a subset of information bits of the set of information bits of the padded compressed payload based on: channel LLRs in the set of channel LLRs corresponding to the subset of information bits; and prior LLRs in the set of prior LLRs corresponding to the subset of information bits.

Clause 25: The method of Clause 24, wherein: the decoded subset of information bits indicates a probability of a bit value of at least one remaining information bit in the subset of information bits; and decoding the encoded padded compressed payload using SCL decoding further comprises decoding the at least one remaining information bit based, at least in part, on the probability of the bit value of the at least one remaining information bit.

Clause 26: The method of any one of Clauses 18-25, wherein the compressed payload bits have a starting bit and an ending bit.

Clause 27: The method of Clause 26, wherein: the starting bit comprises a bit of the compressed payload bits that is encoded before the ending bit; and the ending bit comprises a bit of the compressed payload bits that is encoded after the starting bit.

Clause 28: The method of Clause 27, wherein the padding bits are added in the compressed payload before the starting bit of compressed payload bits.

Clause 29: The method of Clause 27, wherein the padding bits are added in the compressed payload after the ending bit of the compressed payload bits.

Clause 30: The method of any one of Clauses 18-29, wherein the padded compressed payload comprises a first part of the compressed payload having a fixed size and a second part of the compressed payload having a variable size.

Clause 31: The method of Clause 30, wherein: the padding bits are included in the second part of the compressed payload; and removing the padding bits from the padded compressed payload comprises removing the padding bits from the second part of the compressed payload in the padded compressed payload.

Clause 32: The method of Clause 30, wherein the variable size of the second part of the compressed payload depends on a value of one or more bits in the first part of the compressed payload.

Clause 33: The method of Clause 30, wherein: the encoded padded compressed payload, including the padded compressed payload, is encoded based on a Polar code; and the Polar code includes a first set of information bit indices and a second set of frozen bit indices.

Clause 34: The method of Clause 33, wherein: the first part of the compressed payload is mapped to a first subset of information bit indices of the first set of information bit indices; and the second part of the compressed payload is mapped to a second subset of information bit indices of the first set of information bit indices.

Clause 35: The method of any one of Clauses 18-29, wherein the encoded padded compressed payload, including the padded compressed payload, is encoded based on a Polar code.

Clause 36: The method of Clause 35, wherein the Polar code includes a first set of information bit indices and a second set of frozen bit indices.

Clause 37: The method of Clause 36, wherein each information bit index in the first set of information bit indices is associated with a respective level of reliability.

Clause 38: The method of Clause 37, wherein the set of information bits of the padded compressed payload are mapped to the first set of information bit indices in a reverse order of respective levels of reliability of the information bit indices in the first set of information bit indices.

Clause 39: The method of Clause 38, wherein each bit in the set of information bits has a respective level of entropy.

Clause 40: The method of Clause 39, wherein, based on the reverse order, at least one of: a first bit having a lowest entropy in the set of information bits is mapped to a first information bit index having a lowest respective level of reliability in the first set of information bit indices; or a second bit having a highest entropy in the set of information bits is mapped to a second information bit index having a highest respective level of reliability in the first set of information bit indices.

Clause 41: An apparatus, comprising: at least one memory comprising executable instructions; and at least one processor configured to execute the executable instructions and cause the apparatus to perform a method in accordance with any combination of Clauses 1-40.

Clause 42: An apparatus, comprising means for performing a method in accordance with any combination of Clauses 1-40.

Clause 43: A non-transitory computer-readable medium comprising executable instructions that, when executed by at least one processor of an apparatus, cause the apparatus to perform a method in accordance with any combination of Clauses 1-40.

Clause 44: A computer program product embodied on a computer-readable storage medium comprising code for performing a method in accordance with any combination of Clauses 1-40.

Clause 45: A wireless node (e.g., a UE or network entity) comprising: at least one transceiver; at least one memory comprising executable instructions; and at least one processor configured to execute the executable instructions and cause the apparatus to perform a method in accordance with any combination of Clauses 1-17, wherein the at least one transceiver is configured to transmit the encoded padded compressed payload.

Clause 46: A wireless node (e.g., a UE or network entity) comprising: at least one transceiver; at least one memory comprising executable instructions; and at least one processor configured to execute the executable instructions and cause the apparatus to perform a method in accordance with any combination of Clauses 18-40, wherein the at least one transceiver is configured to receive the encoded padded compressed payload.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

As used herein, "a processor," "at least one processor" or "one or more processors" generally refers to a single processor configured to perform one or multiple operations or multiple processors configured to collectively perform one or more operations. In the case of multiple processors, performance of the one or more operations could be divided amongst different processors, though one processor may perform multiple operations, and multiple processors could collectively perform a single operation. Similarly, "a memory," "at least one memory" or "one or more memories" generally refers to a single memory configured to store data and/or instructions, multiple memories configured to collectively store data and/or instructions.

In some cases, rather than actually transmitting a signal, an apparatus (e.g., a wireless node or device) may have an interface to output the signal for transmission. For example, a processor may output a signal, via a bus interface, to a radio frequency (RF) front end for transmission. Accordingly, a means for outputting may include such an interface as an alternative (or in addition) to a transmitter or transceiver. Similarly, rather than actually receiving a signal, an apparatus (e.g., a wireless node or device) may have an interface to obtain a signal from another device. For example, a processor may obtain (or receive) a signal, via a bus interface, from an RF front end for reception. Accordingly, a means for obtaining may include such an interface as an alternative (or in addition) to a receiver or transceiver.

Means for obtaining, means for compressing, means for adding, means for encoding, means for outputting, means for concatenating, means for mapping, means for demodulating, means for decoding, means for removing, means for decompressing, and means for combining may comprise one or more processors, such as one or more of the processors described above with reference to FIG. 11 and/or FIG. 12.

While the present disclosure may describe certain operations as being performed by one type of wireless node, the same or similar operations may also be performed by another type of wireless node. For example, operations performed by a user equipment (UE) may also (or instead) be performed by a network entity (e.g., a base station or unit of a disaggregated base station). Similarly, operations performed by a network entity may also (or instead) be performed by a UE.

Further, while the present disclosure may describe certain types of communications between different types of wireless nodes (e.g., between a network entity and a UE), the same or similar types of communications may occur between same types of wireless nodes (e.g., between network entities or between UEs, in a peer-to-peer scenario). Further, communications may occur in reverse order than described.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more actions for achieving the methods. The method actions may be interchanged with one another without departing from the scope of the claims. In other words, unless a specific order of actions is specified, the order and/or use of specific actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for". All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. An apparatus for wireless communication, comprising:
at least one transceiver;
one or more memories comprising computer-executable instructions; and
one or more processors configured to execute the computer-executable instructions to cause the apparatus to:
obtain a payload;
compress the payload using a variable length compression technique to obtain a compressed payload having compressed payload bits of a first length;
add padding bits to the compressed payload to obtain a padded compressed payload, wherein the padded compressed payload comprises a set of information bits that include the compressed payload bits and the padding bits; and
encode the padded compressed payload using a Polar code, wherein:
the Polar code includes a first set of information bit indices and a second set of frozen bit indices;
each information bit index in the first set of information bit indices is associated with a respective level of reliability; and
transmit, via the at least one transceiver, the encoded padded compressed payload.

2. The apparatus of claim 1, wherein:
the padded compressed payload has a second length that is longer than the first length; and
the Polar code used to encode the padded compressed payload associated with the second length.

3. The apparatus of claim 1, wherein:
the compressed payload bits have a starting bit and an ending bit;
the starting bit comprises a bit of the compressed payload bits that is encoded before the ending bit;
the ending bit comprises a bit of the compressed payload bits that is encoded after the starting bit; and
to add the padding bits to the compressed payload, the one or more processors are further configured to cause the apparatus to one of:
add the padding bits to compressed payload before the starting bit of compressed payload bits; or
add the padding bits to compressed payload after the ending bit of the compressed payload bits.

4. The apparatus of claim 1, wherein:
to compress the payload using the variable length compression technique to obtain the compressed payload, the one or more processors are further configured to cause the apparatus to compress the payload to generate:
a first part of the compressed payload having a fixed size; and
a second part of the compressed payload having a variable size;
to add the padding bits to the compressed payload, the one or more processors are configured to cause the apparatus to add the padding bits to the second part of the compressed payload; and
the one or more processors are further configured to cause the apparatus to concatenate the first part of the compressed payload with the second part of the compressed payload to obtain the padded compressed payload.

5. The apparatus of claim 1, wherein:
to encode the padded compressed payload using the Polar code, the one or more processors are configured to cause the apparatus to map the set of information bits of the padded compressed payload to the first set of information bit indices in a reverse order of respective levels of reliability of the information bit indices in the first set of information bit indices;
each bit in the set of information bits has a respective level of entropy; and
to map the set of information bits to the first set of information bit indices in the reverse order of the respective levels of reliability of the information bit indices in the first set of data it indices, the one or more processors are further configured to cause the apparatus to at least one of:
map a first bit having a lowest entropy in the set of information bits to a first information bit index having a lowest respective level of reliability in the first set of information bit indices; or
map a second bit having a highest entropy in the set of information bits to a second information bit index having a highest respective level of reliability in the first set of information bit indices.

6. The apparatus of claim 1, wherein the apparatus is configured to operate as a user equipment (UE) or a network entity.

7. An apparatus for wireless communication, comprising:
at least one transceiver;
one or more memories comprising computer-executable instructions; and
one or more processors configured to execute the computer-executable instructions to cause the apparatus to:
receive, via the at least one transceiver, an encoded padded compressed payload, wherein:
the encoded padded compressed payload includes a padded compressed payload; and
the padded compressed payload comprises a set of information bits including compressed payload bits and padding bits;
the encoded padded compressed payload, including the padded compressed payload, is encoded based on a Polar code;
the Polar code includes a first set of information bit indices and a second set of frozen bit indices;
each information bit index in the first set of information bit indices is associated with a respective level of reliability;
demodulate the encoded padded compressed payload to obtain a first set of channel log likelihood ratios (LLRs) corresponding to bits in the set of information bits of the padded compressed payload;

decode the encoded padded compressed payload using the set of channel LLRs and a set of prior LLRs to obtain the set of information bits of the padded compressed payload;

remove the padding bits from the padded compressed payload to obtain the compressed payload including the compressed payload bits; and decompress the compressed payload, including the compressed payload bits, to obtain payload bits.

8. The apparatus of claim 7, wherein, at least one of:

each prior LLR in the set of prior LLRs corresponds to a different respective bit of the set of information bits and is generated based on a priori information indicating a probability of that different respective bit having a particular value; or each different respective bit of the set of information bits corresponds to a different respective channel LLR in the set of channel LLRs indicating a probability of that different respective bit having a particular value taking into account noise of a wireless channel over which that different respective bit is received.

9. The apparatus of claim 7, wherein:

to decode the encoded padded compressed payload, the one or more processors are configured to cause the apparatus to decode at least a first information bit in the set of information bits; and to decode at least a first information bit in the set of information bits, the one or more processors are configured to cause the apparatus to:

combine a channel LLR of the set of channel LLRs corresponding to the first information bit with a prior LLR of the set of prior LLRs corresponding to the first information bit to obtain a combined LLR; and decode the first information bit using the combined LLR.

10. The apparatus of claim 9, wherein:

to decode the encoded padded compressed payload, the one or more processors are configured to cause the apparatus to decode the encoded padded compressed payload using successive cancellation list (SLC) decoding; and to decode the encoded padded compressed payload using SLC decoding, the one or more processors are configured to cause the apparatus to decode a subset of information bits of the set of information bits of the padded compressed payload based on at least one of:

channel LLRs in the set of channel LLRs corresponding to the subset of information bits; or prior LLRs in the set of prior LLRs corresponding to the subset of information bits.

11. The apparatus of claim 10, wherein:

the decoded subset of information bits indicates a probability of a bit value of at least one remaining information bit in the subset of information bits; and to decode the encoded padded compressed payload using SCL decoding, the one or more processors are configured to cause the apparatus to decode the at least one remaining information bit based, at least in part, on the probability of the bit value of the at least one remaining information bit.

12. The apparatus of claim 7, wherein:

the compressed payload bits have a starting bit and an ending bit;

the starting bit comprises a bit of the compressed payload bits that is encoded before the ending bit;

the ending bit comprises a bit of the compressed payload bits that is encoded after the starting bit; and at least one of:

the padding bits are added in the compressed payload before the starting bit of compressed payload bits; or the padding bits are added in the compressed payload after the ending bit of the compressed payload bits.

13. The apparatus of claim 7, wherein the padded compressed payload comprises a first part of the compressed payload having a fixed size and a second part of the compressed payload having a variable size.

14. The apparatus of claim 13, wherein, at least one of:

the padding bits are included in the second part of the compressed payload; and to remove the padding bits from the padded compressed payload, the one or more processors are configured to cause the apparatus to remove the padding bits from the second part of the compressed payload in the padded compressed payload, the first part of the compressed payload is mapped to a first subset of information bit indices of the first set of information bit indices; and the second part of the compressed payload is mapped to a second subset of information bit indices of the first set of information bit indices.

15. The apparatus of claim 7, wherein the set of information bits of the padded compressed payload are mapped to the first set of information bit indices in a reverse order of respective levels of reliability of the information bit indices in the first set of information bit indices.

16. The apparatus of claim 15, wherein each bit in the set of information bits has a respective level of entropy.

17. The apparatus of claim 16, wherein, based on the reverse order, at least one of:

a first bit having a lowest entropy in the set of information bits is mapped to a first information bit index having a lowest respective level of reliability in the first set of information bit indices; or a second bit having a highest entropy in the set of information bits is mapped to a second information bit index having a highest respective level of reliability in the first set of information bit indices.

18. The apparatus of claim 7, wherein the apparatus is configured to operate as a user equipment (UE) or a network entity.

19. A method for wireless communication by a wireless node, comprising:

obtaining a payload;

compressing the payload using a variable length compression technique to obtain a compressed payload having compressed payload bits of a first length;

adding padding bits to the compressed payload to obtain a padded compressed payload, wherein the padded compressed payload comprises a set of information bits that include the compressed payload bits and the padding bits; and encoding the padded compressed payload using a Polar code, wherein:

the Polar code includes a first set of information bit indices and a second set of frozen bit indices;

each information bit index in the first set of information bit indices is associated with a respective level of reliability; and transmitting the encoded padded compressed payload.

20. The method of claim 19, wherein:

the compressed payload bits have a starting bit and an ending bit;

the starting bit comprises a bit of the compressed payload bits that is encoded before the ending bit;

the ending bit comprises a bit of the compressed payload bits that is encoded after the starting bit; and adding the padding bits to the compressed payload comprises one of:

adding the padding bits to compressed payload before the starting bit of compressed payload bits; or adding the padding bits to compressed payload after the ending bit of the compressed payload bits.

* * * * *